(12) United States Patent
Matsuda et al.

(10) Patent No.: US 9,614,140 B2
(45) Date of Patent: Apr. 4, 2017

(54) PIEZOELECTRIC CERAMIC, METHOD FOR MAKING SAME, PIEZOELECTRIC ELEMENT, LIQUID DISCHARGE HEAD, ULTRASONIC MOTOR, AND DUST CLEANER

(75) Inventors: Takanori Matsuda, Chofu (JP); Hiroshi Saito, Kawasaki (JP); Tatsuo Furuta, Machida (JP); Jumpei Hayashi, Chofu (JP); Takayuki Watanabe, Yokohama (JP); Toshihiro Ifuku, Yokohama (JP)

(73) Assignee: Canon kabushiki Kaisha, Tokyo (JP)

( * ) Notice: Subject to any disclaimer, the term of this patent is extended or adjusted under 35 U.S.C. 154(b) by 630 days.

(21) Appl. No.: 13/989,756

(22) PCT Filed: Nov. 18, 2011

(86) PCT No.: PCT/JP2011/077277
§ 371 (c)(1),
(2), (4) Date: Sep. 20, 2013

(87) PCT Pub. No.: WO2012/070667
PCT Pub. Date: May 31, 2012

(65) Prior Publication Data
US 2014/0009038 A1    Jan. 9, 2014

(30) Foreign Application Priority Data
Nov. 26, 2010  (JP) ................. 2010-264223

(51) Int. Cl.
*H01L 41/08*  (2006.01)
*H01L 41/187*  (2006.01)
(Continued)

(52) U.S. Cl.
CPC .......... *H01L 41/1871* (2013.01); *B08B 7/028* (2013.01); *B41J 2/161* (2013.01);
(Continued)

(58) Field of Classification Search
CPC .. H01L 41/1871; H01L 41/0973; B41J 2/161; B41J 2/1632
(Continued)

(56) References Cited

U.S. PATENT DOCUMENTS 8,846,556 B2 *  9/2014  Kubota ............... C04B 35/4682
                                                252/62.9 PZ
9,130,168 B2 *  9/2015  Kubota ............... C04B 35/4682
(Continued)

FOREIGN PATENT DOCUMENTS

CN      101621112 A    1/2010
CN      101834269 A    9/2010
(Continued)

OTHER PUBLICATIONS

Kyoichi Kinoshita et al., Journal of Applied Physics, vol. 47, No. 1, Jan. 1976 "Grain-size effects on dielectric properties in barium titanate", pp. 371-373.

*Primary Examiner* — Thomas Dougherty
*Assistant Examiner* — Karen B Addison
(74) *Attorney, Agent, or Firm* — Canon U.S.A., Inc., IP Division

(57) ABSTRACT

A barium titanate piezoelectric ceramic having good piezoelectric properties and mechanical strength and a piezoelectric element that includes the ceramic are provided. A method for making a piezoelectric ceramic includes forming a compact containing barium titanate particles, sintering the compact, and decreasing the temperature of the compact. The sintering includes (A) increasing the temperature of the compact to a temperature range of a shrinking process of the compact; (B) increasing the temperature of the compact to a temperature range of a liquid phase sintering process of the compact; (C) decreasing the temperature of the compact to
(Continued)

the temperature range of the shrinking process of the compact; and (D) retaining the third temperature.

8 Claims, 9 Drawing Sheets

(51) Int. Cl.
  *B41J 2/16* (2006.01)
  *C04B 35/626* (2006.01)
  *B08B 7/02* (2006.01)
  *H01L 41/43* (2013.01)
  *H01L 41/09* (2006.01)
  *H02N 2/10* (2006.01)
  *H02N 2/16* (2006.01)

(52) U.S. Cl.
  CPC ........... *B41J 2/1623* (2013.01); *B41J 2/1632* (2013.01); *B41J 2/1642* (2013.01); *B41J 2/1646* (2013.01); *C04B 35/62655* (2013.01); *H01L 41/0973* (2013.01); *H01L 41/43* (2013.01); *H02N 2/106* (2013.01); *H02N 2/163* (2013.01); *C04B 2235/3201* (2013.01); *C04B 2235/3203* (2013.01); *C04B 2235/3208* (2013.01); *C04B 2235/3213* (2013.01); *C04B 2235/3227* (2013.01); *C04B 2235/3236* (2013.01); *C04B 2235/3244* (2013.01); *C04B 2235/3248* (2013.01); *C04B 2235/3262* (2013.01); *C04B 2235/3298* (2013.01); *C04B 2235/449* (2013.01); *C04B 2235/549* (2013.01); *C04B 2235/5445* (2013.01); *C04B 2235/6562* (2013.01); *C04B 2235/6565* (2013.01); *C04B 2235/6567* (2013.01); *C04B 2235/661* (2013.01); *C04B 2235/77* (2013.01); *C04B 2235/782* (2013.01); *C04B 2235/786* (2013.01)

(58) Field of Classification Search
  USPC .... 310/358, 311, 363, 365, 357; 252/62.9 R; 29/25.35; 427/547, 128, 129, 598; 27/100; 501/137; 264/434; 423/598
  See application file for complete search history.

(56) References Cited

U.S. PATENT DOCUMENTS

2002/0151430 A1* 10/2002 Yamaguchi ......... H01L 41/1871
　　　　　　　　　　　　　　　　　　　　　　501/137
2010/0014214 A1*  1/2010 Yamazaki ............... B32B 18/00
　　　　　　　　　　　　　　　　　　　　　　361/321.4

FOREIGN PATENT DOCUMENTS

| EP | 0468796 A1 | 1/1992 |
| EP | 2141752 A1 | 1/2010 |
| EP | 2328193 A2 | 6/2011 |
| JP | 2004-187384 A | 7/2004 |
| JP | 2008-150247 A | 7/2008 |
| JP | 2010-042969 A | 2/2010 |
| JP | 2010-120835 A | 6/2010 |

* cited by examiner 10 um 100 um

AMBIENT TEMPERATURE (°C)

TEMPERATURE (°C)

PIEZOELECTRIC CERAMIC, METHOD FOR MAKING SAME, PIEZOELECTRIC ELEMENT, LIQUID DISCHARGE HEAD, ULTRASONIC MOTOR, AND DUST CLEANER

TECHNICAL FIELD

The present invention generally relates to piezoelectric ceramics, methods for making the piezoelectric ceramics, liquid discharge heads, ultrasonic motors, and dust cleaners. In particular, it relates to a barium titanate piezoelectric ceramic that has controlled crystal grain size and thus exhibits excellent piezoelectric performance and mechanical strength, a method for making the piezoelectric ceramic, a piezoelectric element including the piezoelectric ceramic, and a liquid discharge head, an ultrasonic motor, and a dust cleaner that include the piezoelectric element.

BACKGROUND ART

Piezoelectric ceramics are commonly perovskite oxides represented by $ABO_3$, such as lead zirconium titanate (PZT).

However, since PZT contains lead as the A-site element, its impact on the environment has been regarded as problem. Piezoelectric ceramics that use lead-free perovskite-type oxides are thus sought after.

Barium titanate is known as a piezoelectric ceramic material of a lead-free perovskite oxide type. PTL 1 discloses barium titanate prepared by a two-stage sintering method. PTL 1 describes that a dense ceramic having a maximum grain diameter of 5 μm or less and excellent piezoelectric properties can be obtained by sintering a nano-sized barium titanate powder by the two-stage sintering method.

However, according to the two-stage sintering method, the length of time the first sintering temperature is retained needs to be small. As a result, the temperature of the ceramic to be sintered becomes uneven and it has been difficult to reproduce high piezoelectric properties.

For example, if a barium titanate ceramic of a practical size is to be sintered, rapid heating and a retention time as short as about 1 minute do not render the temperature of the ceramic even. In other words, not all parts of the sintered ceramic take an ideal nanostructure and thus piezoelectric properties sufficient for replacing PZT have not been achieved.

Another approach is to improve the piezoelectric properties of barium titanate by increasing the size of crystal grains. PTL 2 discloses the relationship between the average grain diameter and piezoelectric constant of calcium-doped barium titanate ceramics. The relationship shows that the piezoelectric constant ($d_{31}$) increases as the average grain diameter of the piezoelectric increases from 1.3 μm to 60.9 μm.

According to PTL 2, the average grain diameter of the ceramic is adjusted by adjusting the length of time of wet-mixing a calcined powder. In addition, the temperature of main sintering following preparation of the calcined powder is increased to also increase the average grain diameter of the ceramic.

However, increasing the average grain diameter of barium titanate ceramics by this method decreases the contact area between crystal grains. This has resulted in a decrease in mechanical strength of the ceramic and thus ceramic parts have been susceptible to cracking during forming processes and operation of piezoelectric elements.

In sum, barium titanate piezoelectric ceramics desirably achieve both excellent piezoelectric properties and high mechanical strength.

Resonator devices such as ultrasonic motors desirably exhibit a high mechanical quality factor Qm. For example, barium titanate can achieve high Qm when doped with a transition metal such as Cr, Mn, Fe, Co, Ni, or the like. However, elements such as Mn act as grain growth accelerators that induce abnormal grain growth as barium titanate is sintered. Accordingly, it is difficult to control the grain diameter by the techniques disclosed in PTL 1 and PTL 2.

According to NPL 1, the structural phase transition between the tetragonal structure and the orthorhombic structure of barium titanate occurs at about room temperature and thus different piezoelectric properties have been observed at the same temperature between when the temperature is increased and when the temperature is decreased in the temperature hysteresis of the piezoelectric properties. Due to this drawback, barium titanate has poor piezoelectric property controllability although it has high piezoelectric properties at room temperature, and it has been difficult to practically apply barium titanate to piezoelectric elements.

CITATION LIST

Patent Literature

PTL 1 Japanese Patent Laid-Open No. 2008-150247
PTL 2 Japanese Patent Laid-Open No. 2010-042969

Non Patent Literature

NPL 1 Journal of Applied Physics, Vol. 47, No. 1, January 1976

SUMMARY OF INVENTION

Technical Problem

The present invention provides a piezoelectric ceramic having good piezoelectric properties and mechanical strength and method for making the piezoelectric ceramic. It also provides a piezoelectric element, a liquid discharge head, an ultrasonic motor, and a dust cleaner that include the piezoelectric ceramic.

Solution to Problem

An aspect of the present invention provides a method for making a piezoelectric ceramic. The method includes forming a compact composed of an oxide powder containing barium titanate particles, sintering the compact, and decreasing the temperature of the compact after the sintering. The sintering includes (A) increasing the temperature of the compact to a first temperature within a temperature range of a shrinking process of the compact; (B) increasing the temperature of the compact to a second temperature within a temperature range of a liquid phase sintering process of the compact after (A); (C) decreasing the temperature of the compact to a third temperature within the temperature range of the shrinking process of the compact after (B); and (D) retaining the third temperature after (C).

Another aspect of the present invention provides a polycrystalline piezoelectric ceramic that includes barium titanate and 0.04% by mass or more and 0.20% by mass or less of manganese relative to the barium titanate. The average circular equivalent diameter of crystal grains constituting the piezoelectric ceramic is 2 µm or more and 9 µm or less, the number percentage of crystal grains having a circular equivalent diameter of 20 µm or less is 99 number % or more, and the relative density of the piezoelectric ceramic is 97.5% or more and 100% or less.

Yet another aspect of the present invention provides a piezoelectric element that includes a first electrode, the above-described piezoelectric ceramic, and a second electrode.

Advantageous Effects of Invention

According to the present invention, a piezoelectric ceramic having good piezoelectric properties and mechanical strength and a method for making the piezoelectric ceramic are provided.

DESCRIPTION OF EMBODIMENTS

Figure 1:
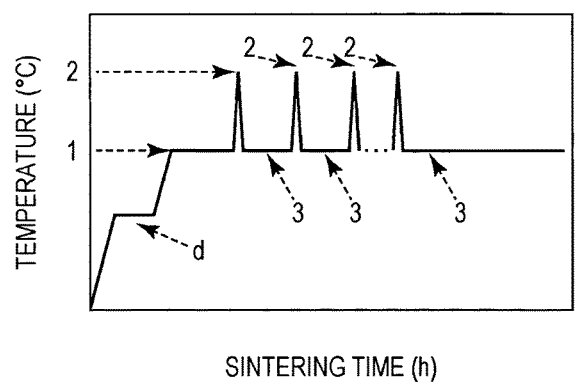
FIG. 1 is a graph showing heating temperature conditions of Examples of the present invention.

Embodiments of the present invention will now be described.

A method for making a piezoelectric ceramic according to one embodiment of the present invention includes forming a compact composed of an oxide powder containing barium titanate particles, sintering the compact, and decreasing the temperature of the compact after the sintering. The sintering includes (A) increasing the temperature of the compact to a first temperature within a temperature range of a shrinking process of the compact; (B) increasing the temperature of the compact to a second temperature within a temperature range of a liquid phase sintering process of the compact after (A); (C) decreasing the temperature of the compact to a third temperature within the temperature range of the shrinking process of the compact after (B); and (D) retaining the third temperature after (C).

In the present invention, the term "ceramic" refers to a polycrystal, i.e., an aggregate (also referred to as "bulk") of crystal grains baked together by heat treatment. The basic component of the ceramic is a metal oxide. A product that is processed after sintering is also included in the meaning of the term. However, powder and slurry prepared by dispersing powder in a solution are excluded from the meaning of the term.

The piezoelectric ceramic contains barium titanate as the main component. The barium titanate is preferably an $ABO_3$ perovskite crystal such as one represented by general formula $BaTiO_3$.

The term "main component" means that barium titanate is the main component for exhibiting piezoelectric properties. For example, the piezoelectric ceramic may contain a component for adjusting characteristics, such as manganese, or impurity components that are inevitable in the production process.

The barium titanate content in the piezoelectric ceramic is 80% by mass or more, preferably 95% by mass or more, and more preferably 99% by mass or more and 99.96% by mass or less. The total content of components other than barium titanate in the piezoelectric ceramic may be limited to less than 20% by mass %. When the total content of the components not contributing to piezoelectric properties is 20% by mass or more, the piezoelectricity of the piezoelectric ceramic as a whole may become insufficient.

Some of the barium (Ba) sites of barium titanate may be substituted with another divalent metal or a quasi divalent metal. Examples of the divalent metal that can substitute the Ba site include Ca and Sr. Examples of the quasi divalent metal that can substitute the Ba site include $(Bi_{0.5}Na_{0.5})$, $(Bi_{0.5}K_{0.5})$, $(Bi_{0.5}Li_{0.5})$, $(La_{0.5}Na_{0.5})$, $(La_{0.5}K_{0.5})$, and $(La_{0.5}Li_{0.5})$. The substitution ratio for substituting the Ba sites with another divalent metal or quasi divalent metal is 20 at. % or less and preferably 10 at. % or less. When the substitution ratio exceeds 20 at. %, high piezoelectric properties inherent in barium titanate may not be fully exhibited. The metal that substitutes the Ba sites is preferably Ca and the substitution ratio thereof is 20 at. % or less. Substitution with Ca can give a piezoelectric ceramic having room-temperature piezoelectric properties lower than that achieved with non-substituted barium titanate but high temperature stability since the phase transition point in the room temperature range shifts to a lower temperature side.

Some of the titanium (Ti) sites of barium titanate may be substituted with another tetravalent metal or quasi tetravalent metal. Examples of the tetravalent metal that can substitute the Ti sites include Zr, Hf, Si, Sn, and Ge. Examples of the quasi tetravalent metal that can substitute the Ti sites include combinations of a divalent metal and a tetravalent metal $(M^{2+}_{1/3}M^{5+}_{2/3})$, combinations of a trivalent metal and a tetravalent metal $(M^{3+}_{1/2}M^{5+}_{1/2})$, and combinations of a trivalent metal and a hexavalent metal $(M^{3+}_{2/3}M^{6+}_{1/3})$.

The oxide powder containing barium titanate particles that serves as the raw material powder of the compact can be obtained by a sol-gel method, a solid phase method, a co-precipitation method, a hydrothermal synthesis method, an alkoxide method, an oxalate method, and other suitable production methods. In the present invention, no limit is imposed as to the production method.

Examples of the binder used in the present invention include polyvinyl acetate (PVA), polyvinyl butyral (PVB), and acrylic binders. Powder may be prepared to exhibit high compactibility, by selecting an optimum binder, and under conditions such that a ceramic obtained by sintering includes minimum amounts of pores. Slurry used in extrusion forming or cast forming may also be prepared to exhibit high compactibility and under conditions such that a ceramic obtained by sintering includes minimum amounts of pores.

The compact may be formed by uniaxial pressing, cold isostatic pressing (CIP), warm isostatic pressing (WIP), hot isostatic pressing (HIP), or the like. Isostatic pressing may be performed after uniaxial pressing. A die forming method such as extrusion forming or cast forming may also be employed.

Sintering may be performed in a resistance-heating electric furnace, a gas furnace, an image furnace, a microwave furnace, a millimeter-wave furnace, or the like.

In the method for making a piezoelectric ceramic, the first temperature is 900° C. or more and 1200° C. or less, the second temperature is 1350° C. or more and 1550° C. or less, and the third temperature is 900° C. or more and 1200° C. or less.

Figure 6:
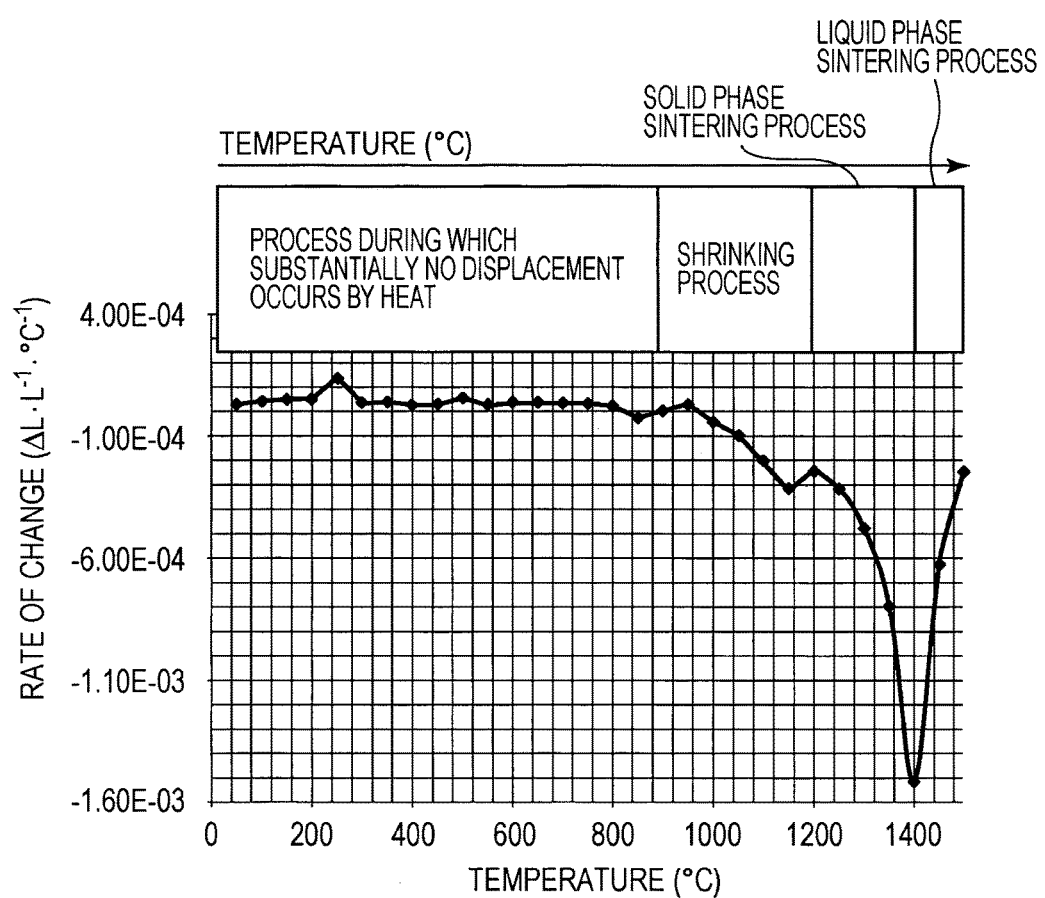
FIG. 6 is a conceptual diagram illustrating sintering processes of a compact.

In order to check the state of sintering, the dimensions of the compact may be measured while monitoring the sintering process of the compact during heating to calculate the shrinkage ratio. Examples of the method for monitoring include a method of observing the compact with a microscope under heating in the heating stage, and a method that uses a heat shrinkage analyzer (TD5020SA, product of Bruker AXS) that reads the displacement by directly making contact with the compact during heating. The shrinkage ratio can be calculated from a displacement per unit temperature relative to a particular temperature range while keeping the temperature change rate constant during temperature increase or temperature decrease. FIG. 6 is a graph showing the change in shrinkage ratio plotted versus the temperature of barium titanate measured by the method that uses a microscope. Note that the measurement method is not particularly limited.

FIG. 6 shows an example of the temperature and the rate of change in shrinkage ratio in sintering processes of the compact containing barium titanate as a main component. A schematic diagram for promoting an understanding of the sintering processes based on the temperature is given in the upper part of FIG. 6.

In this example shown in FIG. 6, a temperature range from room temperature to about 800° C. is the process during which displacement does not substantially occur by heating. In this example, as the temperature increases, the compact gradually undergoes displacement toward shrinking in a temperature range from about 900° C. to about 1200° C. This process of gradual shrinking is called "shrinking process". In this example, there is a temperature range in which the shrinkage ratio increases further compared to the shrinkage ratio during the shrinking process. This temperature range lies from about 1200° C. to about 1400° C. In this temperature range, solid phase reaction starts and then liquid phase reaction locally starts on surfaces of particles as the temperature is further increased. Thus, the solid phase reaction and the liquid phase reaction occur substantially simultaneously at some temperatures in this temperature range. However, for the purposes of this invention, this shrinking process is referred to as "solid phase sintering process" during which sintering by the solid phase reaction is the main reaction. In this example, the shrinkage ratio decreases rapidly (=the plotted value increases rapidly versus the increase in temperature) after the inflection point of the change in shrinking ratio in a temperature range from about 1400° C. to about 1500° C. and finally reaches the melting point. This temperature range also includes a temperature range where the solid phase reaction and the liquid phase reaction substantially occur simultaneously in some parts. However, for the purposes of this invention, this process is referred to as "liquid phase sintering process" during which sintering by the liquid phase reaction is the main reaction. Each of the sintering processes can be identified from the profile of the graph indicating the shrinkage ratio versus temperature, the inflection point in the profile, and observation of liquefaction of ends of samples, for example.

FIG. 1 shows the conditions for heating the compact.

In FIG. 1, d indicates a degreasing step. The temperatures labeled as 1, 2, and 3 in the drawing respectively indicate the first temperature, second temperature, and third temperature. The first temperature 1 is set in the temperature range of 900° C. to 1200° C., which is the temperature range of the shrinking process of the compact, and the temperature of the compact is increased to the first temperature 1 and maintained thereat (step (A)). As a result, the compact continues to shrink without grain growth and thus the compact can have a density higher than that of the compact as formed by compacting.

Next, the second temperature 2 is set in the temperature range of 1350° C. to 1550° C., which is the temperature range of the liquid phase sintering process of the compact. The temperature of the compact is increased to the second temperature 2 (step (B)) and then decreased from the second temperature 2 to a third temperature 3 in the range of 900° C. to 1200° C., which is the temperature range of the shrinking process of the compact (step (C)). As a result, crystallites with a uniform grain diameter of about 10 μm or less can be formed by liquid phase reaction sintering without abnormal grain growth.

Next, the compact is retained at the third temperature 3 (step (D)), which is the temperature in the range of 900° C. to 1200° C. at which the shrinking process of the compact occurs. As a result, internal stress and strains of the crystallites can be moderated and crystallites can be rearranged while eliminating defects so as to achieve a high density.

In the method for making the piezoelectric ceramic, the steps (B), (C), and (D) described above may be repeated 2 to 20 times.

The steps (B), (C), and (D) are indispensable to formation of crystallites with a uniform grain diameter. By repeating the series of steps, the crystallinity of each crystallite is improved and crystallites of higher quality can be formed. The quality improves as the number of times the steps are repeated increases. The number of times these steps are repeated is preferably 20 or less from the productivity standpoint.

In the method for making the piezoelectric ceramic, the rate of increasing the temperature to the second temperature in the step (B) is 10° C./min or more and 30° C./min or less.

The rate of increasing the temperature is the change in temperature per unit time of the temperature indicated in a thermocouple installed near the compact in an electric furnace. If the rate is lower than 10° C./min, the reaction proceeds at a temperature in the liquid phase sintering process and abnormal grain growth may occur. When the rate is higher than 30° C./min, the capacity of the electric furnace may not be sufficient for such a high rate. Even if the electric furnace can heat at a rate higher than 30° C./min, the load imposed on the furnace is too large and the productivity may be impaired. Furthermore, when the compact is heated excessively rapidly, the evenness of the temperature of the compact as a whole may not be maintained and uneven sintering may occur. Accordingly, the rate of increasing the temperature is preferably 10° C./min or more and 30° C./min or less and more preferably 15° C./min or more and 25° C./min or less.

The method for making the piezoelectric ceramic includes a degreasing step before the step (A) described above. In the degreasing step, the compact is retained at a temperature lower than or equal to the first temperature.

The degreasing step is a step of removing the binder component needed for forming the compact. When the shape of the compact is difficult to keep, the degreasing step may be conducted simultaneously with the compact sintering step.

In the method for making the piezoelectric ceramic, the difference between the second temperature in the step (B) and the first temperature in the step (A) is 200° C. or more and 500° C. or less.

The difference in temperature changes depending on the composition of the material. In order to clearly separate the steps of forming crystallites and rearranging the crystallites and make them more efficient, the difference in temperature needs to be at least 200° C. However, shrinking does not proceed and the temperature may exceed the melting point if the difference is 500° C. or more. Preferably, the difference in temperature is 350° C. or more and 450° C. or less.

In the method for making the piezoelectric ceramic, the difference in temperature between the first temperature in the step (A) and the third temperature in the steps (C) and (D) is 30° C. or less.

The grain diameter of the crystallites in the step (A) is different from the grain diameter of the crystallites in the steps (C) and (D) due to this difference in temperature. However, the compositions are the same. Thus, the difference in temperature may be 30° C. or less.

In the method for making the piezoelectric ceramic, the retention time in the step (A) is 60 to 240 minutes.

When the retention time is shorter than 60 minutes, shrinking of the compact without grain growth is insufficient. Thus, the distance between crystallites is widened during the subsequent formation of crystallites and thus a ceramic having a high density may not be obtained. From the productivity standpoint, the retention time is 240 min or less and preferably 150 min or more and 200 min or less.

In the method for making the piezoelectric ceramic, the second temperature is retained for 5 minutes or less after the step (B) described above.

If the retention time of the second temperature is longer than 5 minutes, liquid phase sintering excessively proceeds during the retention time and abnormal grain growth may occur. More preferably, the retention time is 3 min or less.

In the method for making the piezoelectric ceramic, the cumulative retention time in the step (D) is 10 to 70 hours.

If the cumulative retention time in the process (D) is shorter than 10 hours, the internal stress and strains of the formed crystallites may not be sufficiently moderated or rearrangement of the crystallites while eliminating defects may become insufficient. From the productivity standpoint, the cumulative retention time is preferably 70 hours or less and more preferably 10 to 30 hours.

In the method for making the piezoelectric ceramic, the oxide powder contains 0.04 to 0.20 mass % of manganese on a metal basis relative to the barium titanate.

The oxide powder contains 0.04% by mass or more and 0.20% by mass or less, preferably 0.05% by mass or more and 0.17% by mass or less of manganese relative to the barium titanate component. Manganese is not limited to metallic manganese and may take any form as long as manganese is contained in the piezoelectric ceramic as a manganese component. For example, manganese may be dissolved in barium titanate. Alternatively, manganese components in form of metal, ion, oxide, metal salt, complex, etc., may be contained in the piezoelectric ceramic. When piezoelectric ceramic containing barium titanate as the main component contains a manganese component in the above-described range, the insulating property and mechanical quality factor Qm are improved. When the manganese content is less than 0.04 mass %, the effect achieved by addition of manganese may not be obtained. At a content exceeding 0.20 mass %, hexagonal barium titanate having lower piezoelectricity is mixed in and thus the piezoelectricity of the piezoelectric ceramic as a whole may be degraded.

In the method for making the piezoelectric ceramic, the average diameter of primary particles of barium titanate particles that serve as a raw material powder in the compact may be 1 µm or less.

If the average particle diameter of the barium titanate particles in the compact is larger than 1 µm, many of crystal grains obtained by sintering are coarse crystal grains having a circular equivalent diameter larger than 20 µm and thus desired piezoelectric properties are not obtained. The average particle diameter of primary particles of barium titanate in the compact is more preferably 300 nm or less.

A piezoelectric ceramic according to an embodiment of the present invention is a polycrystalline piezoelectric ceramic that contains barium titanate and 0.04% by mass or more and 0.20% by mass or less of manganese relative to barium titanate. The average circular equivalent diameter of crystal grains constituting the piezoelectric ceramic is 2 µm or more and 9 µm or less. The percentage of crystal grains having a circular equivalent diameter of 20 µm or less is 99% on a number basis. The relative density of the piezoelectric ceramic is 97.5% or more and 100% or less.

The term "circular equivalent diameter" refers to what is generally known as "projected area diameter" in microscopy and indicates the diameter of a circle having the same area as the projected area of a crystal grain. For the purposes of the present invention, the method for measuring the circular equivalent diameter is not particularly limited. For example, an image of a surface of a piezoelectric ceramic may be taken with a polarizing microscope or a scanning electron microscope and the image may be processed to determine the circular equivalent diameter. Since the optimum magnification differs depending on the grain diameter to be analyzed, an optical microscope and an electron microscope may be properly used. The circular equivalent diameter may be determined from an image of a polished surface or a cross-section instead of the surface of the ceramic.

The minima of a Young's modulus $Y_{11}$ of the piezoelectric ceramic differs between when the temperature is being increased and when the temperature is being decreased in a temperature range of −30° C. to 50° C.

The Young's modulus $Y_{11}$ can be calculated by a resonant-antiresonant technique by preparing a piezoelectric element having electrodes. A commercially available thermo-hygrostat is used in controlling temperature during measurement and the Young's modulus is measured by a resonant-antiresonant technique at desired temperatures by repeating increasing and decreasing the temperature in the temperature range of about −40° C. to 60° C. However, the method for measuring $Y_{11}$ is not particularly limited.

A piezoelectric element according to an embodiment of the present invention includes a first electrode, a piezoelectric ceramic, and a second electrode. The piezoelectric ceramic described above is used as the piezoelectric ceramic.

The first and second electrodes are each constituted by a conductive layer having a thickness of about 5 to 2000 nm. The material thereof is not particularly limited and any material commonly used in piezoelectric elements may be used. Examples of the material include metals such as Ti, Pt, Ta, Ir, Sr, In, Sn, Au, Al, Fe, Cr, Ni, Pd, and Ag and oxides thereof. The first and second electrodes may each be composed of one of these materials or made by stacking two or more of these materials. The first and second electrodes may be composed of materials different from each other.

The method for making the first and second electrodes is not limited. The electrodes may be made by baking a metal paste, sputtering, or vapor deposition. Both the first and second electrodes may be patterned to have desired shapes.

A piezoelectric element that includes the piezoelectric ceramic will now be described.

A piezoelectric element according to an embodiment of the present invention includes a first electrode, a piezoelectric ceramic, and a second electrode. This piezoelectric ceramic is the piezoelectric ceramic discussed above.

The first and second electrodes are each constituted by a conductive layer having a thickness of about 5 to 2000 nm. The material thereof is not particularly limited and any material commonly used in piezoelectric elements may be used. Examples of the material include metals such as Ti, Pt, Ta, Ir, Sr, In, Sn, Au, Al, Fe, Cr, Ni, Pd, Ag, and Cu and oxides thereof. The first and second electrodes may each be composed of one of these materials or made by stacking two or more of these materials. The first and second electrodes may be composed of materials different from each other.

The method for making the first and second electrodes is not limited. The electrodes may be made by baking a metal paste, sputtering, or vapor deposition. Both the first and second electrodes may be used by patterning to have desired shapes.

Figure 7A:
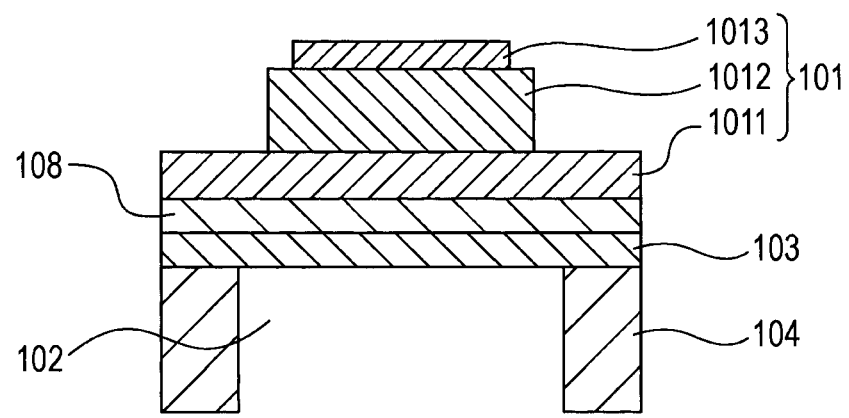
FIGS. 7A and 7B are schematic views showing one embodiment of a liquid discharge head.
Figure 7B:
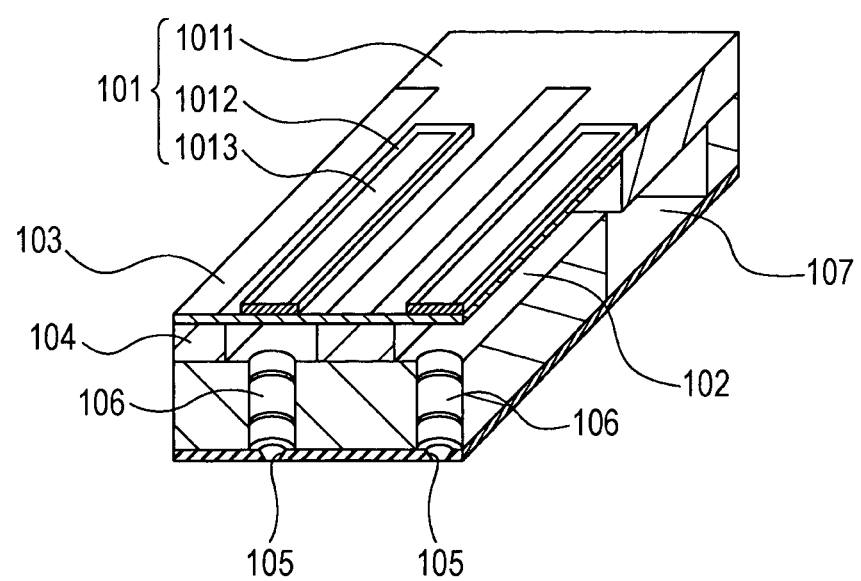

FIGS. 7A and 7B are schematic views showing one embodiment of a structure of a liquid discharge head according to the present invention. As shown in FIGS. 7A and 7B, the liquid discharge head includes a piezoelectric element 101. The piezoelectric element 101 includes a first electrode 1011, a piezoelectric ceramic 1012, and a second electrode 1013. The piezoelectric ceramic 1012 is patterned as needed as shown in FIG. 7B.

FIG. 7B is a schematic diagram of the liquid discharge head. The liquid discharge head includes a discharge port 105, an individual liquid chamber 102, a connecting hole 106 connecting between the individual liquid chamber 102 and the discharge port 105, a liquid chamber wall 104, a common liquid chamber 107, a vibrating plate 103, and the piezoelectric element 101. In the drawing, the piezoelectric element 101 is rectangular but may take any other shape such as elliptical, circular, or rectangular parallelepiped. In general, the piezoelectric ceramic 1012 has the shape corresponding to the shape of the individual liquid chamber 102.

The parts around the piezoelectric element 101 in the liquid discharge head are described in detail with reference to FIG. 7A. FIG. 7A is a cross-sectional view of the liquid discharge head shown in FIG. 7B taken in the width direction of the liquid discharge head. The cross-sectional shape of the piezoelectric element 101 is illustrated as rectangular but may be trapezoid or inverted trapezoid.

A buffer layer 108 may be disposed between the vibrating plate 103 and the first electrode 1011.

The vibrating plate 103 of the liquid discharge head vibrates vertically by expansion and contraction of the piezoelectric ceramic 1012 and applies pressure to the liquid inside the individual liquid chamber 102. As a result, the liquid is discharged from the discharge port 105. The liquid discharge head can be used in printers and production of electronic devices.

The thickness of the vibrating plate 103 is 1.0 μm or more and 15 μm or less and preferably 1.5 μm or more and 8 μm or less. The material for the vibrating plate is not limited but is preferably Si which may be doped with boron (B) or phosphorus (P). The buffer layer and the electrode layer on the vibrating plate may form part of the vibrating plate.

The thickness of the buffer layer 108 is 5 nm or more and 300 nm or less and preferably 10 nm or more and 200 nm or less.

The size of the discharge port 105 is 5 μm or more and 40 μm or less in terms of circular equivalent diameter. The shape of the discharge port 105 may be circular, star-shaped, rectangular, triangular, or the like.

Embodiments of an ultrasonic motor that includes the piezoelectric element according to the present invention will now be described.

Figure 8A:
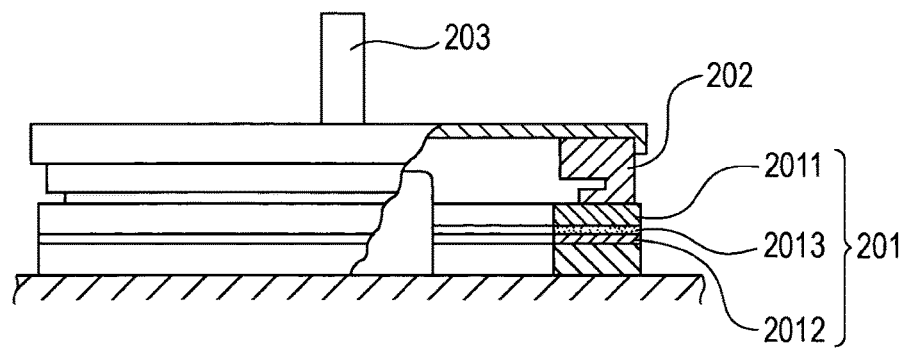
FIGS. 8A and 8B show embodiments of ultrasonic motors.
Figure 8B:
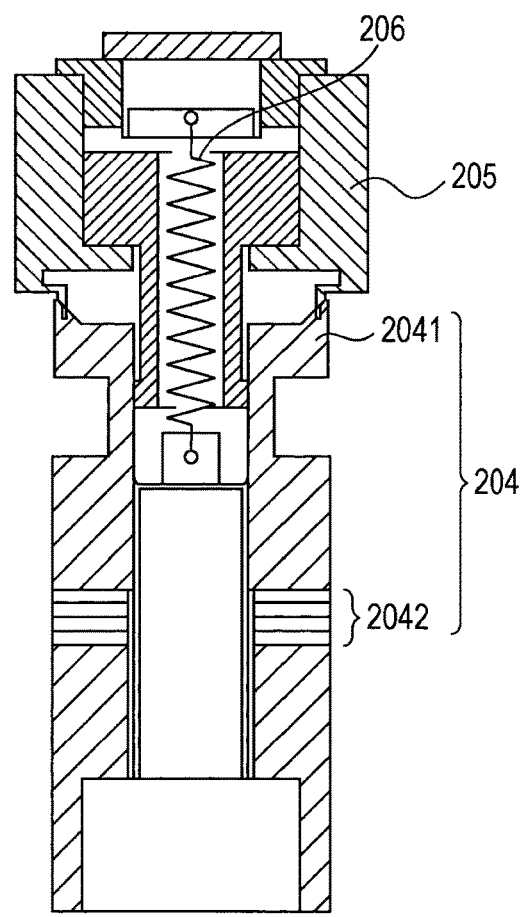

FIGS. 8A and 8B are schematic views showing embodiments of ultrasonic motors.

An ultrasonic motor that includes a piezoelectric element of a single-plate type is shown in FIG. 8A. The ultrasonic motor includes a vibrator 201, a rotor 202 urged by a pressure spring (not shown) to make pressure-contact with a sliding surface of the vibrator 201, and an output shaft 203 integrated with the rotor 202. The vibrator 201 is constituted by a metal elastic ring 2011, a piezoelectric element 2012 according to an embodiment of the present invention, and an organic adhesive 2013 (based on epoxy, cyanoacrylate, or the like) that bonds the piezoelectric element 2012 to the elastic ring 2011. The piezoelectric element 2012 is constituted by a piezoelectric ceramic sandwiched by a first electrode and a second electrode (not shown).

When two phases of AC voltage shifted from each other by π/2 are applied to the piezoelectric element, a bending traveling wave is generated in the vibrator 201 and each point on the sliding surface of the vibrator 201 undergoes elliptical motion. Since the rotor 202 is in pressure-contact with the sliding surface of the vibrator 201, the rotor 202 receives frictional force from the vibrator 201 and rotates in a direction opposite to the bending travelling wave. An object to be driven not shown in the drawing is joined to the output shaft 203 and driven by turning force of the rotor 202.

Application of voltage to the piezoelectric ceramic causes the piezoelectric ceramic to expand and contract by a transversal piezoelectric effect. When an elastic body such as metal is joined to the piezoelectric element, the elastic body is bent by expansion and contraction of the piezoelectric ceramic. The ultrasonic motor of a type described herein is based on such a principle.

Next, an ultrasonic motor that includes a piezoelectric element having a multilayer structure is described with reference to FIG. 8B. A vibrator 204 of this ultrasonic motor includes a multilayer piezoelectric element 2042 sandwiched in a cylindrical metal elastic body 2041. The multilayer piezoelectric element 2042 is an element constituted by a stack of a plurality of layers of piezoelectric ceramics not shown in the drawing and includes a first electrode and a second electrode at outer surfaces of the stack and internal electrodes in the interior of the stack. The metal elastic body 2041 is bolted to fix the piezoelectric element 2042 and thus the vibrator 204 is made.

Application of different phases of AC voltage to the piezoelectric element 2042 causes the vibrator 204 to induce two vibrations that are orthogonal to each other. The two vibrations are combined and form a circular vibration for driving the tip of the vibrator 204. An annular groove is formed in the upper portion of the vibrator 204 to increase the displacement of the vibration for driving.

The rotor 205 makes pressure-contact with the vibrator 204 by the spring 206 for pressuring to obtain frictional force for driving. The rotor 205 is rotatably supported by bearings.

Next, a dust cleaner that includes the piezoelectric element of the present invention is described.

Figure 9A:
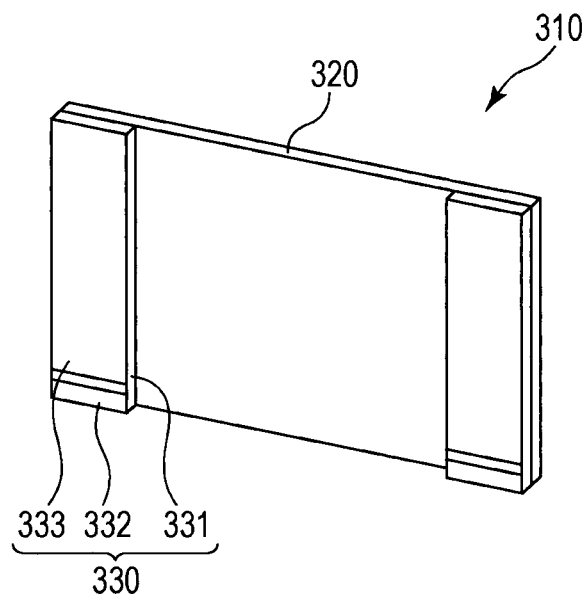
FIGS. 9A and 9B show an embodiment of a dust cleaner.
Figure 9B:
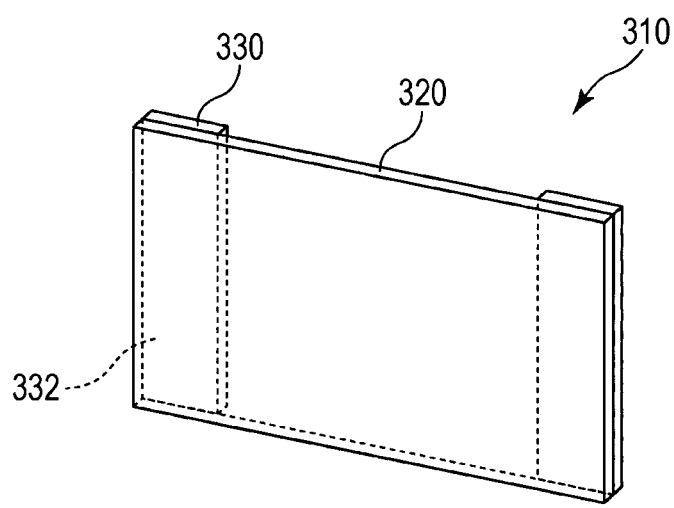

FIGS. 9A and 9B are schematic views showing a dust cleaner according to one embodiment of the present invention. A dust cleaner 310 includes a plate-shape piezoelectric element 330 and a vibrating plate 320. The material for the vibrating plate 320 is not limited. An optically transparent material or a light-reflecting material may be used as the material for the vibrating plate 320 when the dust cleaner 310 is used in optical devices.

Figure 10A:
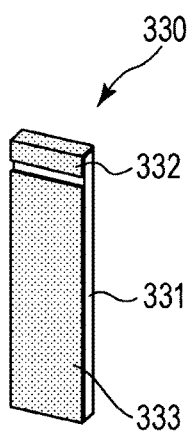
FIGS. 10A to 10C are schematic diagrams showing piezoelectric elements in the dust cleaner.
Figure 10B:
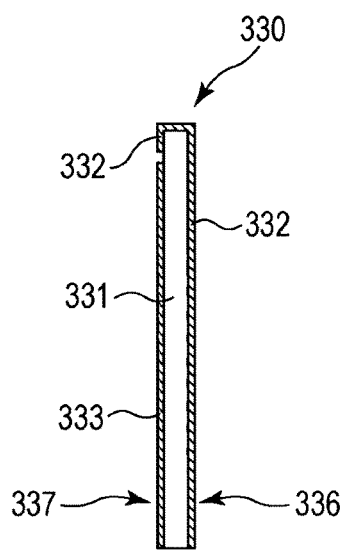
Figure 10C:
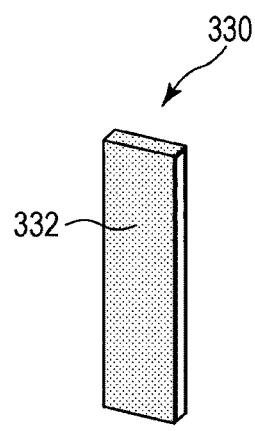

FIGS. 10A to 10C are schematic diagrams showing the piezoelectric element 330 shown in FIGS. 9A and 9B. FIGS. 10A and 10C show the structures of the front surface and rear surface of the piezoelectric element 330, respectively. FIG. 10B shows a structure of a side surface. As shown in FIGS. 10A to 10C, the piezoelectric element 330 is constituted by a piezoelectric ceramic 331, a first electrode 332, and a second electrode 333. The first electrode 332 and the second electrode 333 are arranged to oppose the plate surfaces of the piezoelectric ceramic 331. A surface on which the first electrode 332 is disposed and which is shown in FIG. 10C is a first electrode surface 336. A surface on which the second electrode 332 is disposed and which is shown in FIG. 10A is the second electrode surface 337.

For the purposes of the invention, the "electrode surface" refers to a surface of a piezoelectric element on which an electrode is disposed. For example, as shown in FIGS. 10A to 10C, the first electrode 332 may extend to lie on part of the second surface 337.

As shown in FIGS. 9A and 9B, the piezoelectric element 330 is fixed to the vibrating plate 320 at the first electrode surface 336 of the piezoelectric element 330. When the piezoelectric element 330 is driven, stress is generated between the piezoelectric element 330 and the vibrating plate 320 and an out-of-plane vibration is generated in the vibrating plate 320. The dust cleaner 310 removes foreign substances such as dust on the surface of the vibrating plate 320 by using this out-of-plane vibration of the vibrating plate 320. The out-of-plane vibration is an elastic vibration that causes the vibrating plate to be displaced in the optical axis direction, i.e., the thickness direction of the vibrating plate.

Figure 11A:
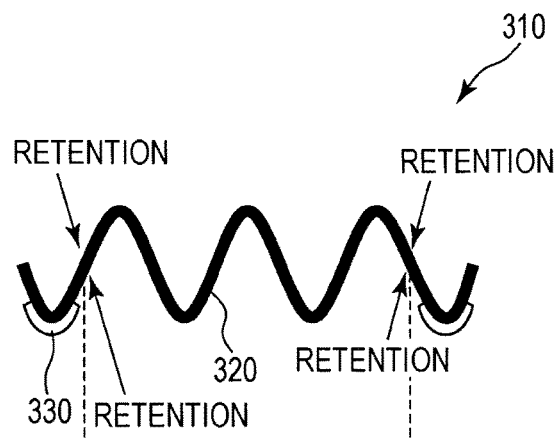
FIGS. 11A and 11B are diagrams showing the principle of vibration of the dust cleaner.
Figure 11B:
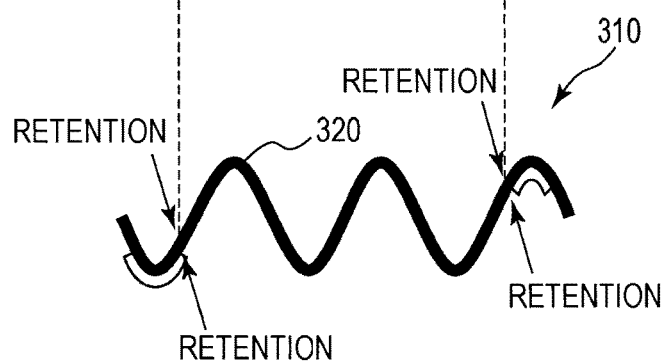

FIGS. 11A and 11B are schematic diagrams showing the principle of vibration of the dust cleaner 310. FIG. 11A shows a state where alternating electric fields of the same phase are applied to the pair of right and left piezoelectric elements 330 to generate the out-of-plane vibration in the vibrating plate 320. The polarization direction of the piezoelectric ceramics constituting the pair of right and left piezoelectric elements 330 is the same as the thickness direction of the piezoelectric elements 330 and the dust cleaner 310 is driven in a seventh vibration mode. FIG. 11B shows a state where alternating voltages having reversed phases 180° different from each other to the pair of right and left piezoelectric elements 330 to generate the out-of-plane vibration in the vibrating plate 320. The dust cleaner 310 is driven in a sixth vibration mode. The dust cleaner 310 can effectively remove dust attached to the surface of the vibrating plate by properly using at least two vibration modes.

As mentioned above, the piezoelectric element of the present invention is suitable for use in liquid discharge heads, ultrasonic motors, and dust cleaners.

When a lead-free piezoelectric ceramic containing an oriented oxide ceramic of the present invention is used, a liquid discharge head that has a nozzle density and discharge force comparable or superior to those achieved by using leaded piezoelectric ceramic can be provided.

When a lead-free piezoelectric ceramic containing an oriented oxide ceramic of the present invention is used, an ultrasonic motor that has driving force and durability comparable or superior to those achieved by using leaded piezoelectric ceramic can be provided.

When a lead-free piezoelectric ceramic containing an oriented oxide ceramic of the present invention is used, a dust cleaner that has a dust cleaning efficiency comparable or superior to that achieved by using leaded piezoelectric ceramic can be provided.

The piezoelectric ceramic of the present invention can be used in liquid discharge heads, motors, ultrasonic vibrators, piezoelectric actuators, piezoelectric sensors, ferroelectric memories, and other devices.

Examples 1 to 14

The present invention will now be described in further detail using examples below which do not limit the scope of the invention.

Manganese(II) acetate was caused to adhere to surfaces of barium titanate particles having an average particle diameter of 100 nm produced by a hydrothermal synthesis method using a spray dryer. According to inductively coupled plasma (ISP)-mass spectroscopy, the manganese content in this powder was 0.12% by mass. The manganese content was controllable by adjusting the raw material feed ratio in the spray dryer.

The powder was compressed into a disk-shaped compact using a press machine at a pressure of 200 MPa. The compact may be further pressed using a cold isostatic press machine or the like.

In order to determine the heating conditions of this compact, the change in shrinkage ratio was measured. First, the compact was degreased for the shrinkage ratio measurement. In degreasing, a resistive heating electric furnace is used to conduct heating at 450° C. for 50 hours to remove organic components such as the binder. The degreased compact was processed into a size that can be placed on a heating stage on which observation is possible under heating from room temperature to 1500° C. to prepare an observation sample. Observation was conducted using an optical microscope while increasing the temperature at 20° C./min and taking a picture every 20° C. Then the displacement per degree Celsius was measured to calculate the shrinkage ratio.

The changes in shrinkage ratio of the observation samples of this example at respective heating temperatures were then classified.

The shrinkage ratio did not substantially change in a temperature range from room temperature to about 900° C. Gradual displacement occurred from about 900° C. to about 1050° C. in the compact shrinking direction. For the purposes of the present invention, this temperature range was referred to as "shrinking process". The compact shrunk at a shrinkage ratio higher than that in the shrinking process from about 1050° C. to about 1350° C. This temperature range was referred to as "solid phase sintering process". Once the temperature exceeded 1350° C., the shrinkage ratio gradually decreased and reached zero at 1450° C., thereby reaching the melting point. At this stage, liquefying of the sample from an end portion was observed with a microscope. This temperature range was referred to as "liquid phase sintering process".

Table 1 shows the main component of the compact and the amount of Mn fed, the average particle diameter of primary particles of the raw material, and the temperature ranges of the shrinking process, solid-phase sintering process, and liquid phase sintering process and the melting point of the compact determined by the shrinkage ratio measurement.

TABLE 1

| Compact | Composition Mn content (mass %) | Composition Main component | Average diameter of primary particles (μm) | Shrinking process (° C.) | Solid phase sintering process (° C.) | Liquid phase sintering process (° C.) | Melting point (MP) (° C.) |
|---|---|---|---|---|---|---|---|
| A | 0.12 | $BaTiO_3$ | 0.10 | $900 \le T < 1050$ | $1050 \le T < 1350$ | $1350 \le T < 1450$ | 1450 |
| B | 0.04 | $BaTiO_3$ | 0.10 | $900 \le T < 1050$ | $1050 \le T < 1350$ | $1350 \le T < 1450$ | 1450 |
| C | 0.15 | $BaTiO_3$ | 0.10 | $900 \le T < 1050$ | $1050 \le T < 1350$ | $1350 \le T < 1450$ | 1450 |
| D | 0.12 | $BaTiO_3$ | 0.05 | $900 \le T < 1050$ | $1050 \le T < 1350$ | $1350 \le T < 1450$ | 1450 |
| E | 0.12 | $BaTiO_3$ | 1.10 | $900 \le T < 1050$ | $1050 \le T < 1350$ | $1350 \le T < 1450$ | 1450 |
| F | 0.21 | $BaTiO_3$ | 0.10 | $900 \le T < 1050$ | $1050 \le T < 1350$ | $1350 \le T < 1450$ | 1450 |
| G | 0.03 | $BaTiO_3$ | 0.10 | $900 \le T < 1050$ | $1050 \le T < 1350$ | $1350 \le T < 1450$ | 1450 |
| H | 0.12 | $Ba_{0.9}Ca_{0.1}TiO_3$ | 0.20 | $950 \le T < 1200$ | $1200 \le T < 1450$ | $1450 \le T < MP$ | $1550 \le$ |
| I | 0.08 | $Ba_{0.9}Ca_{0.1}TiO_3$ | 0.20 | $950 \le T < 1200$ | $1200 \le T < 1450$ | $1450 \le T < MP$ | $1550 \le$ |
| J | 0.20 | $Ba_{0.9}Ca_{0.1}TiO_3$ | 0.20 | $950 \le T < 1200$ | $1200 \le T < 1450$ | $1450 \le T < MP$ | $1550 \le$ |
| K | 0.12 | $Ba_{0.9}Ca_{0.1}TiO_3$ | 1.10 | $950 \le T < 1200$ | $1200 \le T < 1450$ | $1450 \le T < MP$ | $1550 \le$ |
| L | 0.21 | $Ba_{0.9}Ca_{0.1}TiO_3$ | 0.20 | $950 \le T < 1200$ | $1200 \le T < 1450$ | $1450 \le T < MP$ | $1550 \le$ |
| M | 0.03 | $Ba_{0.9}Ca_{0.1}TiO_3$ | 0.20 | $950 \le T < 1200$ | $1200 \le T < 1450$ | $1450 \le T < MP$ | $1550 \le$ |
| N | 0.12 | $Ba_{0.81}Ca_{0.19}Ti_{0.94}Zr_{0.06}O_3$ | 0.20 | $950 \le T < 1200$ | $1200 \le T < 1360$ | $1360 \le T < MP$ | $1550 \le$ |
| O | 0.08 | $Ba_{0.81}Ca_{0.19}Ti_{0.94}Zr_{0.06}O_3$ | 0.20 | $950 \le T < 1200$ | $1200 \le T < 1360$ | $1360 \le T < MP$ | $1550 \le$ |
| P | 0.20 | $Ba_{0.81}Ca_{0.19}Ti_{0.94}Zr_{0.06}O_3$ | 0.20 | $950 \le T < 1200$ | $1200 \le T < 1360$ | $1360 \le T < MP$ | $1550 \le$ |
| Q | 0.12 | $Ba_{0.81}Ca_{0.19}Ti_{0.94}Zr_{0.06}O_3$ | 1.10 | $950 \le T < 1200$ | $1200 \le T < 1360$ | $1360 \le T < MP$ | $1550 \le$ |
| R | 0.21 | $Ba_{0.81}Ca_{0.19}Ti_{0.94}Zr_{0.06}O_3$ | 0.20 | $950 \le T < 1200$ | $1200 \le T < 1360$ | $1360 \le T < MP$ | $1550 \le$ |
| S | 0.03 | $Ba_{0.81}Ca_{0.19}Ti_{0.94}Zr_{0.06}O_3$ | 0.20 | $950 \le T < 1200$ | $1200 \le T < 1360$ | $1360 \le T < MP$ | $1550 \le$ |

The heating conditions of Example 1 were determined on the basis of Table 1. Sintering conditions were as follows. The temperature was first increased from room temperature to 600° C. at a rate of 10° C./min and retained at 600° C. for 3 hours to conduct degreasing. Then the temperature was increased to a first temperature 1010° C. at a rate of 10° C./min and retained at 1010° C. for 3 hours to shrink the compact. After completion of sufficient shrinking, the temperature was increased to a second temperature of 1420° C. at a rate of 20° C./min, retained at the second temperature 1420° C. for 1 minute, decreased to a third temperature 1010° C. at a rate of 20° C./min, and retained thereat for 3 hours. During the course, primary crystal grains were grown to a diameter equivalent to several micrometers. The step of increasing the temperature from the third temperature 1010° C. to the second temperature 1420° C. and decreasing the temperature from the second temperature 1420° C. to the third temperature 1010° C. was repeated. Then the temperature was retained at the third temperature for 10 hours and left to decrease to room temperature so as to promote rearrangement of grains while maintaining the grain diameter formed in the previous step. As a result, a highly dense barium titanate oxide ceramic with low inner stress was obtained.

Combinations of the heating conditions in Examples 1 to 14 and the compact used in each example are shown in Table 2. The types of compact are indicated in Table 1. The heating conditions described in Table 2 are as follows: the first temperature, the length of time the first temperature is retained, judgment as to whether the first temperature is within the temperature range of the shrinking process observed (YES if the first temperature is within the range and NO if it is outside the range), the second temperature, the rate of increasing the temperature from the first temperature to the second temperature, the length of time the second temperature is retained, the number of times the temperature is increased to the second temperature, judgment as to whether the second temperature is within the liquid phase sintering temperature range observed (YES if the second temperature is within the range and NO if it is outside the range), the third temperature, the length of time the third temperature is retained, and judgment as to whether the third temperature is within the shrinking process temperature range (YES if the second temperature is within the range and NO if it is outside the range).

TABLE 2

| | Composition | First temperature (° C.) | Retention time (h) | Within shrinking process temperature range? | Second temperature (° C.) | Temperature increasing rate (° C./min) | Retention time (min) | No. of times the temperature was increased to second temperature | Within liquid phase sintering temperature range? | Third temperature (° C.) | Retention time (h) | Within shrinking process temperature range? |
|---|---|---|---|---|---|---|---|---|---|---|---|---|
| Ex. 1 | A | 1010 | 3 | Yes | 1420 | 20 | 1 | 2 | Yes | 1010 | 10 | Yes |
| Ex. 2 | A | 1010 | 3 | Yes | 1380 | 20 | 1 | 2 | Yes | 1010 | 10 | Yes |
| Ex. 3 | A | 950 | 3 | Yes | 1420 | 20 | 1 | 2 | Yes | 950 | 10 | Yes |
| Ex. 4 | A | 1010 | 3 | Yes | 1420 | 20 | 1 | 2 | Yes | 1030 | 10 | Yes |
| Ex. 5 | A | 1010 | 3 | Yes | 1420 | 10 | 1 | 2 | Yes | 1010 | 10 | Yes |
| Ex. 6 | A | 1010 | 3 | Yes | 1420 | 30 | 1 | 2 | Yes | 1010 | 10 | Yes |
| Ex. 7 | A | 1010 | 3 | Yes | 1420 | 20 | 1 | 3 | Yes | 1010 | 10 | Yes |
| Ex. 8 | A | 1010 | 3 | Yes | 1420 | 20 | 1 | 20 | Yes | 1010 | 10 | Yes |
| Ex. 9 | A | 1010 | 1 | Yes | 1420 | 20 | 5 | 2 | Yes | 1010 | 10 | Yes |
| Ex. 10 | A | 1010 | 3 | Yes | 1420 | 20 | 0.5 | 2 | Yes | 1010 | 55 | Yes |
| Ex. 11 | A | 1010 | 4 | Yes | 1420 | 20 | 1 | 2 | Yes | 1010 | 10 | Yes |
| Ex. 12 | B | 1010 | 3 | Yes | 1420 | 20 | 1 | 2 | Yes | 1010 | 10 | Yes |
| Ex. 13 | C | 1010 | 3 | Yes | 1420 | 20 | 1 | 2 | Yes | 1010 | 10 | Yes |
| Ex. 14 | D | 1010 | 3 | Yes | 1420 | 20 | 1 | 2 | Yes | 1010 | 10 | Yes |
| C. Ex. 1 | A | — | — | — | 1400 | 10 | 120 | 0 | Yes | — | — | — |
| C. Ex. 2 | A | — | — | — | 1420 | 10 | 1 | 1 | Yes | 1190 | 10 | No |
| C. Ex. 3 | A | — | — | — | 1400 | 10 | 120 | 0 | Yes | 1010 | 10 | Yes |
| C. Ex. 4 | A | 1050 | 3 | No | 1420 | 20 | 1 | 2 | Yes | 1050 | 10 | No |
| C. Ex. 5 | A | 850 | 3 | No | 1420 | 20 | 1 | 2 | Yes | 850 | 10 | No |
| C. Ex. 6 | A | 1010 | 0.5 | Yes/retention time: No | 1420 | 20 | 1 | 2 | Yes | 1010 | 10 | Yes |
| C. Ex. 7 | A | 1010 | 3 | Yes | 1420 | 20 | 6 | 2 | Yes/retention time: No | 1010 | 10 | Yes |
| C. Ex. 8 | A | 1010 | 3 | Yes | 1420 | 20 | 1 | 2 | Yes | 1010 | 8 | Yes/retention time: No |
| C. Ex. 9 | A | 1010 | 3 | Yes | 1460 | 20 | 1 | 2 | No | 1010 | 10 | Yes |
| C. Ex. 10 | A | 1010 | 3 | Yes | 1340 | 20 | 1 | 2 | No | 1010 | 10 | Yes |
| C. Ex. 11 | A | 1010 | 3 | Yes | 1420 | 20 | 1 | 2 | Yes | 970 | 10 | Yes/temperature difference: No |
| C. Ex. 12 | A | 1010 | 3 | Yes | 1420 | 20 | 1 | 1 | Yes | 1010 | 3 | Yes |
| C. Ex. 13 | A | 1010 | 3 | Yes | 1420 | 8 | 1 | 2 | Yes | 1010 | 3 | Yes |
| C. Ex. 14 | E | 1010 | 3 | Yes | 1420 | 20 | 1 | 2 | Yes | 1010 | 3 | Yes |
| C. Ex. 15 | F | 1010 | 3 | Yes | 1420 | 20 | 1 | 2 | Yes | 1010 | 3 | Yes |
| C. Ex. 16 | G | 1010 | 3 | Yes | 1420 | 20 | 1 | 2 | Yes | 1010 | 3 | Yes |

Ex.: Example
C. Ex.: Comparative Example

Examples 15 to 20

Barium titanate particles having an average particle diameter of 100 nm prepared by a hydrothermal synthesis method and calcium titanate having an average particle diameter of 300 nm prepared by a solid phase reaction method were mixed at a molar ratio of 9:1 and the resulting mixture was mixed in a ball mill for 24 hours to prepare calcium-doped barium titanate. As in Examples 1 to 14, manganese(II) oxide was caused to adhere to surface of the mixed powder to obtain calcium barium titanate particles having a manganese content of 0.12% by mass. The manganese content was controllable by adjusting the raw material feed ratio in the spray dryer.

The powder was compressed into a disk-shaped compact using a press machine at a pressure of 200 MPa. The compact may be further pressed using a cold isostatic press machine or the like.

In order to determine the heating conditions of this compact, the change in shrinkage ratio was measured. First, the compact was degreased for the shrinkage ratio measurement. In degreasing, a resistive heating electric furnace is used to conduct heating at 450° C. for 50 hours to remove organic components such as the binder. The degreased compact was processed into a size that can be placed on a heating stage on which observation is possible under heating from room temperature to 1500° C. to prepare an observation sample. Observation was conducted using an optical microscope while increasing the temperature at 20° C./min and taking a picture every 20° C. Then the displacement per degree Celsius was measured to calculate the shrinkage ratio.

The changes in shrinkage ratio of the observation samples of this example at respective heating temperatures were then classified.

The shrinkage ratio did not substantially change in a temperature range from room temperature to about 950° C. Gradual displacement occurred from about 950° C. to about 1200° C. in the compact shrinking direction. For the purposes of the present invention, this temperature range was referred to as "shrinking process". The compact shrunk at a shrinkage ratio higher than that in the shrinking process from about 1200° C. to about 1450° C. This temperature range was referred to as "solid phase sintering process". Once the temperature exceeded 1450° C., the shrinkage ratio decreased gradually. Temperatures of 1500° C. or higher could not be directly measured with the measurement instrument but the shrinkage ratio could be predicted to reach zero near the melting point of about 1550° C. At this stage, liquefying of the sample from an end portion was observed with a microscope. This temperature range was referred to as "liquid phase sintering process".

Table 1 shows the main component of the compact and the amount of Mn fed, the average particle diameter of primary particles of the raw material, and the temperature ranges of the shrinking process, solid-phase sintering process, and liquid phase sintering process and the melting point (MP) of the compact determined by the shrinkage ratio measurement.

The heating conditions of Example 15 were determined on the basis of Table 1. Sintering conditions were as follows. The temperature was first increased from room temperature to 600° C. at a rate of 10° C./min and retained at 600° C. for 3 hours to conduct degreasing. Then the temperature was increased to a first temperature 1100° C. at a rate of 10° C./min and retained at 1100° C. for 3 hours to shrink the compact. After completion of sufficient shrinking, the temperature was increased to a second temperature of 1550° C. at a rate of 20° C./min, retained at the second temperature 1550° C. for 1 minute, decreased to a third temperature 1100° C. at a rate of 20° C./min, and retained thereat for 3 hours. During the course, primary crystal grains were grown to a diameter equivalent to several micrometers. The step of increasing the temperature from the third temperature 1100° C. to the second temperature 1550° C. and decreasing the temperature from the second temperature 1550° C. to the third temperature 1100° C. was repeated. Then the temperature was retained at the third temperature for 10 hours and left to decrease to room temperature so as to promote rearrangement of grains while maintaining the grain diameter formed in the previous step. As a result, a highly dense barium titanate oxide ceramic with low inner stress was obtained.

Similarly, combinations of the heating conditions in Examples 15 to 20 and the compact used in each example are shown in Table 3. The types of compact are indicated in Table 1. The heating conditions described in Table 3 are as follows: the first temperature, the length of time the first temperature is retained, judgment as to whether the first temperature is within the temperature range of the shrinking process observed (YES if the first temperature is within the range and NO if it is outside the range), the second temperature, the rate of increasing the temperature from the first temperature to the second temperature, the length of time the second temperature is retained, the number of times the temperature is increased to the second temperature, judgment as to whether the second temperature is within the liquid phase sintering temperature range observed (YES if the second temperature is within the range and NO if it is outside the range), the third temperature, the length of time the third temperature is retained, and judgment as to whether the third temperature is within the shrinking process temperature range (YES if the second temperature is within the range and NO if it is outside the range).

TABLE 3

| | Composition | First temperature (° C.) | Retention time (h) | Within shrinking process temperature range? | Second temperature (° C.) | Temperature increasing rate (° C./min) | Retention time (min) | No. of times the temperature was increased to second temperature | Within liquid phase sintering temperature range? | Third temperature (° C.) | Retention time (h) | Within shrinking process temperature range? |
|---|---|---|---|---|---|---|---|---|---|---|---|---|
| Example 15 | H | 1100 | 3 | Yes | 1550 | 20 | 1 | 2 | Yes | 1100 | 10 | Yes |
| Example 16 | H | 1000 | 3 | Yes | 1450 | 20 | 1 | 2 | Yes | 1000 | 10 | Yes |
| Example 17 | H | 1150 | 3 | Yes | 1550 | 20 | 1 | 2 | Yes | 1150 | 10 | Yes |
| Example 18 | H | 1100 | 3 | Yes | 1550 | 20 | 1 | 3 | Yes | 1100 | 10 | Yes |
| Example 19 | H | 1100 | 3 | Yes | 1550 | 20 | 1 | 2 | Yes | 1100 | 10 | Yes |
| Example 20 | I | 1100 | 3 | Yes | 1550 | 20 | 1 | 2 | Yes | 1100 | 10 | Yes |
| Comparative Example 17 | J | — | — | — | 1550 | 10 | 120 | 0 | Yes | — | — | — |
| Comparative Example 18 | H | — | — | — | 1550 | 10 | 1 | 1 | Yes | 1250 | 10 | No |
| Comparative Example 19 | H | — | — | — | 1550 | 10 | 120 | 0 | Yes | 1100 | 10 | No |
| Comparative Example 20 | H | 1250 | 3 | No | 1550 | 20 | 1 | 2 | Yes | 1250 | 10 | No |
| Comparative Example 21 | H | 900 | 3 | No | 1550 | 20 | 1 | 2 | Yes | 900 | 10 | No |
| Comparative Example 22 | H | 1100 | 0.5 | Yes/Retention time: No | 1550 | 20 | 1 | 2 | Yes | 1100 | 10 | Yes |
| Comparative Example 23 | H | 1100 | 3 | Yes | 1550 | 20 | 8 | 2 | Yes/Retention time: No | 1100 | 10 | Yes |
| Comparative Example 24 | H | 1100 | 3 | Yes | 1550 | 20 | 1 | 2 | Yes | 1100 | 8 | Yes/Retention time: No |
| Comparative Example 25 | H | 1100 | 3 | Yes | 1560 | 20 | 1 | 2 | No | 1100 | 10 | Yes |
| Comparative Example 26 | H | 1100 | 3 | Yes | 1340 | 20 | 1 | 2 | No | 1100 | 10 | Yes |
| Comparative Example 27 | H | 1040 | 3 | Yes | 1550 | 20 | 1 | 2 | Yes | 1040 | 10 | Yes/temperature difference: No |
| Comparative Example 28 | H | 1100 | 3 | Yes | 1550 | 20 | 1 | 1 | Yes | 1100 | 3 | Yes |
| Comparative Example 29 | H | 1100 | 3 | Yes | 1550 | 8 | 1 | 2 | Yes | 1100 | 3 | Yes |
| Comparative Example 30 | K | 1100 | 3 | Yes | 1550 | 20 | 1 | 2 | Yes | 1100 | 3 | Yes |
| Comparative Example 31 | L | 1100 | 3 | Yes | 1550 | 20 | 1 | 2 | Yes | 1100 | 3 | Yes |
| Comparative Example 32 | M | 1100 | 3 | Yes | 1550 | 20 | 1 | 2 | Yes | 1100 | 3 | Yes |

Examples 21 to 26

Barium titanate particles having an average particle diameter of 100 nm prepared by a hydrothermal synthesis method, calcium titanate having an average particle diameter of 300 nm prepared by a solid phase reaction method, and calcium zirconate having an average particle diameter of 300 nm were mixed at a molar ratio of 81:13:6 and the resulting mixture was mixed in a ball mill for 24 hours. Manganese(II) oxide was caused to adhere to surface of the resulting mixed powder as in Examples 1 to 14 to obtain calcium barium titanate having a Mn content of 0.12 mass %. The manganese content was controllable by adjusting the raw material feed ratio in the spray dryer.

The powder was compressed into a disk-shaped compact using a press machine at a pressure of 200 MPa. The compact may be further pressed using a cold isostatic press machine or the like.

In order to determine the heating conditions of this compact, the change in shrinkage ratio was measured. First, the compact was degreased for the shrinkage ratio measurement. In degreasing, a resistive heating electric furnace is used to conduct heating at 450° C. for 50 hours to remove organic components such as the binder. The degreased compact was processed into a size that can be placed on a heating stage on which observation is possible under heating from room temperature to 1500° C. to prepare an observation sample. Observation was conducted using an optical microscope while increasing the temperature at 20° C./min and taking a picture about every 20° C. Then the displacement per degree Celsius was measured to calculate the shrinkage ratio.

The changes in shrinkage ratio of the observation samples of this example at respective heating temperatures were then classified.

The shrinkage ratio did not substantially change in a temperature range from room temperature to about 950° C. Gradual displacement occurred from about 950° C. to about 1200° C. in the compact shrinking direction. For the purposes of the present invention, this temperature range was referred to as "shrinking process". The compact shrunk at a shrinkage ratio higher than that in the shrinking process from about 1200° C. to about 1360° C. This temperature range was referred to as "solid phase sintering process". Once the temperature exceeded 1360° C., the shrinkage ratio decreased gradually. Temperatures of 1500° C. or higher could not be directly measured with the measurement instrument but the shrinkage ratio could be predicted to reach zero near the melting point of about 1550° C. At this stage, liquefying of the sample from an end portion was observed with a microscope. This temperature range was referred to as "liquid phase sintering process".

Table 1 shows the main component of the compact and the amount of Mn fed, the average particle diameter of primary particles of the raw material, and the temperature ranges of the shrinking process, solid-phase sintering process, and liquid phase sintering process and the melting point (MP) of the compact determined by the shrinkage ratio measurement.

The heating conditions of Example 21 were determined on the basis of Table 1. Sintering conditions were as follows. The temperature was first increased from room temperature to 600° C. at a rate of 10° C./min and retained at 600° C. for 3 hours to conduct degreasing. Then the temperature was increased to a first temperature 1100° C. at a rate of 10° C./min and retained at 1100° C. for 3 hours to shrink the compact. After completion of sufficient shrinking, the temperature was increased to a second temperature of 1450° C. at a rate of 20° C./min, retained at the second temperature 1450° C. for 1 minute, decreased to a third temperature 1100° C. at a rate of 20° C./min, and retained thereat for 3 hours. During the course, primary crystal grains were grown to a diameter equivalent to several micrometers. The step of increasing the temperature from the third temperature 1100° C. to the second temperature 1450° C. and decreasing the temperature from the second temperature 1450° C. to the third temperature 1100° C. was repeated. Then the temperature was retained at the third temperature for 10 hours and left to decrease to room temperature so as to promote rearrangement of grains while maintaining the grain diameter formed in the previous step. As a result, a highly dense barium calcium zirconate titanate oxide ceramic with low inner stress was obtained.

Similarly, combinations of the heating conditions in Examples 21 to 26 for forming calcium-doped barium titanate and the compact used in each example are shown in Table 4. The types of compact are indicated in Table 1. The heating conditions described in Table 4 are as follows: the first temperature, the length of time the first temperature is retained, judgment as to whether the first temperature is within the temperature range of the shrinking process observed (YES if the first temperature is within the range and NO if it is outside the range), the second temperature, the rate of increasing the temperature from the first temperature to the second temperature, the length of time the second temperature is retained, the number of times the temperature is increased to the second temperature, judgment as to whether the second temperature is within the liquid phase sintering temperature range observed (YES if the second temperature is within the range and NO if it is outside the range), the third temperature, the length of time the third temperature is retained, and judgment as to whether the third temperature is within the shrinking process temperature range (YES if the second temperature is within the range and NO if it is outside the range).

TABLE 4

| | Composition | First temperature (° C.) | Retention time (h) | Within shrinking process temperature range? | Second temperature (° C.) | Temperature increasing rate (° C./min) | Retention time (min) |
|---|---|---|---|---|---|---|---|
| Ex. 21 | N | 1100 | 3 | Yes | 1450 | 20 | 1 |
| Ex. 22 | N | 1000 | 3 | Yes | 1360 | 20 | 1 |
| Ex. 23 | N | 1150 | 3 | Yes | 1450 | 20 | 1 |
| Ex. 24 | N | 1100 | 3 | Yes | 1450 | 20 | 1 |
| Ex. 25 | O | 1100 | 3 | Yes | 1450 | 20 | 1 |
| Ex. 26 | P | 1100 | 3 | Yes | 1450 | 20 | 1 |
| C. Ex. 33 | N | — | — | — | 1450 | 10 | 120 |
| C. Ex. 34 | N | — | — | — | 1450 | 10 | 1 |

TABLE 4-continued

| | | | | | | | |
|---|---|---|---|---|---|---|---|
| C. Ex. 35 | N | — | — | — | 1450 | 10 | 120 |
| C. Ex. 36 | N | 1250 | 3 | No | 1450 | 20 | 1 |
| C. Ex. 37 | N | 900 | 3 | No | 1450 | 20 | 1 |
| C. Ex. 38 | N | 1100 | 0.5 | Yes/ Retention time: No | 1450 | 20 | 1 |
| C. Ex. 39 | N | 1100 | 3 | Yes | 1450 | 20 | 8 |
| C. Ex. 40 | N | 1100 | 3 | Yes | 1450 | 20 | 1 |
| C. Ex. 41 | N | 1100 | 3 | Yes | 1500 | 20 | 1 |
| C. Ex. 42 | N | 1100 | 3 | Yes | 1300 | 20 | 1 |
| C. Ex. 43 | N | 1040 | 3 | Yes | 1450 | 20 | 1 |
| C. Ex. 44 | N | 1100 | 3 | Yes | 1450 | 20 | 1 |
| C. Ex. 45 | N | 1100 | 3 | Yes | 1450 | 8 | 1 |
| C. Ex. 46 | Q | 1100 | 3 | Yes | 1450 | 20 | 1 |
| C. Ex. 47 | R | 1100 | 3 | Yes | 1450 | 20 | 1 |
| C. Ex. 48 | S | 1100 | 3 | Yes | 1450 | 20 | 1 |

| | No. of times the temperature was increased to second temperature | Within liquid phase sintering temperature range? | Third temperature (° C.) | Retention time (h) | Within shrinking process temperature range? |
|---|---|---|---|---|---|
| Ex. 21 | 2 | Yes | 1100 | 10 | Yes |
| Ex. 22 | 2 | Yes | 1000 | 10 | Yes |
| Ex. 23 | 2 | Yes | 1150 | 10 | Yes |
| Ex. 24 | 3 | Yes | 1100 | 10 | Yes |
| Ex. 25 | 2 | Yes | 1100 | 10 | Yes |
| Ex. 26 | 2 | Yes | 1100 | 10 | Yes |
| C. Ex. 33 | 0 | Yes | — | — | — |
| C. Ex. 34 | 1 | Yes | 1250 | 10 | No |
| C. Ex. 35 | 0 | Yes | 1100 | 10 | No |
| C. Ex. 36 | 2 | Yes | 1250 | 10 | No |
| C. Ex. 37 | 2 | Yes | 900 | 10 | No |
| C. Ex. 38 | 2 | Yes | 1100 | 10 | Yes |
| C. Ex. 39 | 2 | Yes/ Retention time: No | 1100 | 10 | Yes |
| C. Ex. 40 | 2 | Yes | 1100 | 8 | Yes/ Retention time: No |
| C. Ex. 41 | 2 | No | 1100 | 10 | Yes |
| C. Ex. 42 | 2 | No | 1100 | 10 | Yes |
| C. Ex. 43 | 2 | Yes | 1040 | 10 | Yes/ temperature difference: No |
| C. Ex. 44 | 1 | Yes | 1100 | 3 | Yes |
| C. Ex. 45 | 2 | Yes | 1100 | 3 | Yes |
| C. Ex. 46 | 2 | Yes | 1100 | 3 | Yes |
| C. Ex. 47 | 2 | Yes | 1100 | 3 | Yes |
| C. Ex. 48 | 2 | Yes | 1100 | 3 | Yes |

Ex.: Example
C. Ex.: Comparative Example

Comparative Examples 1 to 16

The compact used in Comparative Examples 1 was the same as the compact A in Table 1 used in Example 1.

The composition of the compact A, the average particle diameter of primary particles of the raw material, and the temperature ranges of the shrinking process, solid-phase sintering process, and liquid phase sintering process and the melting point of the compact are shown in Table 1.

Table 2 shows the heating conditions of Comparative Example 1. Sintering conditions were as follows. The temperature was first increased from room temperature to 600° C. at a rate of 10° C./min and retained at 600° C. for 3 hours to conduct degreasing. Then the temperature was increased to a second temperature 1400° C. at a rate of 10° C./min and retained at 1400° C. for 2 hours to sinter the compact. Then the compact was left to cool to room temperature. As a result, a barium titanate oxide ceramic of Comparative Example 1 was obtained.

Combinations of the heating conditions and the compact used in each Comparative Example in Comparative Examples 1 to 16 determined in the same manner are shown in Table 2. The types of the compacts are as shown in Table 1.

The heating conditions described in Table 2 are as follows: the first temperature, the length of time the first temperature is retained, judgment as to whether the first temperature is within the temperature range of the shrinking process observed (YES if the first temperature is within the range and NO if it is outside the range), the second temperature, the rate of increasing the temperature from the first temperature to the second temperature, the length of time the second temperature is retained, the number of times the temperature is increased to the second temperature, judgment as to whether the second temperature is within the liquid phase sintering temperature range observed (YES if the second temperature is within the range and NO if it is outside the range), the third temperature, the length of time the third temperature is retained, and judgment as to whether the third temperature is within the shrinking process temperature range (YES if the second temperature is within the range and NO if it is outside the range).

Comparative Examples 17 to 32

The compact used in Comparative Examples 17 was the same as the compact H in Table 1 used in Example 15.

The composition of the compact H, the average particle diameter of primary particles of the raw material, and the temperature ranges of the shrinking process, solid-phase sintering process, and liquid phase sintering process and the melting point (MP) of the compact are shown in Table 1.

Table 3 shows the heating conditions of Comparative Example 17. Sintering conditions were as follows. The temperature was first increased from room temperature to 600° C. at a rate of 10° C./min and retained at 600° C. for 3 hours to conduct degreasing. Then the temperature was increased to a second temperature 1550° C. at a rate of 10° C./min and retained at 1550° C. for 2 hours to sinter the compact. Then the compact was left to cool to room temperature. As a result, a calcium-doped barium titanate oxide ceramic of Comparative Example 17 was obtained.

Similarly, combinations of the heating conditions for calcium-doped barium titanate of Comparative Examples 17 to 32 and the compact used in each Comparative Example are shown in Table 3. The types of the compacts are as shown in Table 1.

The heating conditions described in Table 3 are as follows: the first temperature, the length of time the first temperature is retained, judgment as to whether the first temperature is within the temperature range of the shrinking process observed (YES if the first temperature is within the range and NO if it is outside the range), the second temperature, the rate of increasing the temperature from the first temperature to the second temperature, the length of time the second temperature is retained, the number of times the temperature is increased to the second temperature, judgment as to whether the second temperature is within the liquid phase sintering temperature range observed (YES if the second temperature is within the range and NO if it is outside the range), the third temperature, the length of time the third temperature is retained, and judgment as to whether the third temperature is within the shrinking process temperature range (YES if the second temperature is within the range and NO if it is outside the range).

Comparative Examples 33 to 48

The compact used in Comparative Example 33 was the same as the compact N in Table 1 used in Example 21.

The composition of the compact N, the average particle diameter of primary particles of the raw material, and the temperature ranges of the shrinking process, solid-phase sintering process, and liquid phase sintering process and the melting point of the compact are shown in Table 1.

Table 4 shows the heating conditions of Comparative Example 33. Sintering conditions were as follows. The temperature was first increased from room temperature to 600° C. at a rate of 10° C./min and retained at 600° C. for 3 hours to conduct degreasing. Then the temperature was increased to a second temperature 1450° C. at a rate of 10° C./min and retained at 1450° C. for 2 hours to sinter the compact. Then the compact was left to cool to room temperature. As a result, a calcium-doped barium titanate oxide ceramic of Comparative Example 33 was obtained.

Combinations of the heating conditions and the compact used in each Comparative Example in Comparative Examples 33 to 48 determined in the same manner are shown in Table 4. The types of the compacts are as shown in Table 1.

The heating conditions described in Table 4 are as follows: the first temperature, the length of time the first temperature is retained, judgment as to whether the first temperature is within the temperature range of the shrinking process observed (YES if the first temperature is within the range and NO if it is outside the range), the second temperature, the rate of increasing the temperature from the first temperature to the second temperature, the length of time the second temperature is retained, the number of times the temperature is increased to the second temperature, judgment as to whether the second temperature is within the liquid phase sintering temperature range observed (YES if the second temperature is within the range and NO if it is outside the range), the third temperature, the length of time the third temperature is retained, and judgment as to whether the third temperature is within the shrinking process temperature range (YES if the second temperature is within the range and NO if it is outside the range).

Analysis of Piezoelectric Ceramic

Table 5 shows the relative density, average circular equivalent diameter, the number percentage of grains 20 μm or less in circular equivalent diameter, piezoelectric constant $d_{31}$ at room temperature, piezoelectric constant $e_{31}$, mechanical quality factor Qm, Young's modulus $Y_{11}$, and mechanical strength of the piezoelectric ceramics obtained in Examples 1 to 14 and Comparative Examples 1 to 16.

TABLE 5

| | Relative density (%) | Average circular equivalent diameter (μm) | Number percentage of grains 20 μm or less in circular equivalent diameter(%) | Piezoelectric constant $d_{31}$ (pm/V) | Young's modulus $Y_{11}$ (GPa) | $e_{31}$ (N/V · m) | Mechanical quality factor Qm | Mechanical strength (MPa) |
|---|---|---|---|---|---|---|---|---|
| Ex. 1 | 98.9 | 5.6 | 100 | 121 | 100 | 12.1 | 1400 | 121 |
| Ex. 2 | 97.8 | 5.2 | 100 | 114 | 97 | 11.1 | 1220 | 110 |
| Ex. 3 | 97.6 | 2.2 | 100 | 112 | 95 | 10.6 | 1050 | 108 |
| Ex. 4 | 98.8 | 5.4 | 100 | 120 | 100 | 12.0 | 1350 | 118 |
| Ex. 5 | 98.3 | 6.5 | 99 | 118 | 105 | 12.4 | 1450 | 107 |
| Ex. 6 | 99.1 | 5.1 | 100 | 122 | 99 | 12.1 | 1100 | 122 |
| Ex. 7 | 99.2 | 5.2 | 100 | 121 | 101 | 12.2 | 1420 | 105 |
| Ex. 8 | 99.5 | 5.4 | 100 | 126 | 98 | 12.3 | 980 | 107 |
| Ex. 9 | 98.6 | 4.6 | 100 | 109 | 97 | 10.6 | 1030 | 101 |
| Ex. 10 | 99.2 | 5.8 | 99 | 119 | 98 | 11.7 | 1150 | 120 |
| Ex. 11 | 99.0 | 5.6 | 100 | 120 | 100 | 12.0 | 1310 | 125 |
| Ex. 12 | 98.8 | 5.1 | 100 | 141 | 95 | 13.4 | 530 | 115 |
| Ex. 13 | 98.4 | 5.3 | 100 | 109 | 111 | 12.1 | 1650 | 123 |
| Ex. 14 | 98.7 | 4.9 | 100 | 121 | 98 | 11.9 | 1310 | 121 |

TABLE 5-continued

| | Relative density (%) | Average circular equivalent diameter (μm) | Number percentage of grains 20 μm or less in circular equivalent diameter(%) | Piezoelectric constant $d_{31}$ (pm/V) | Young's modulus $Y_{11}$ (GPa) | $e_{31}$ (N/V·m) | Mechanical quality factor Qm | Mechanical strength (MPa) |
|---|---|---|---|---|---|---|---|---|
| C. Ex. 1 | 98.5 | 86 | 45 | 105 | 110 | 11.6 | 1300 | 65 |
| C. Ex. 2 | 96.8 | 1.3 | 100 | 95 | 99 | 9.4 | 650 | 45 |
| C. Ex. 3 | 98.7 | 123 | 38 | 109 | 120 | 13.1 | 1380 | 70 |
| C. Ex. 4 | 97.1 | 8.6 | 64 | 101 | 103 | 10.4 | 980 | 90 |
| C. Ex. 5 | 93.5 | 1.9 | 100 | 91 | 98 | 8.9 | 620 | 65 |
| C. Ex. 6 | 96.8 | 1.7 | 100 | 94 | 100 | 9.4 | 880 | 88 |
| C. Ex. 7 | 97.7 | 21 | 76 | 110 | 115 | 12.7 | 1200 | 40 |
| C. Ex. 8 | 98.1 | 5.1 | 96 | 107 | 117 | 12.5 | 960 | 60 |
| C. Ex. 9 | 99.1 | 45 | 71 | 102 | 112 | 11.4 | 1420 | 35 |
| C. Ex. 10 | 94.2 | 1.1 | 100 | 91 | 97 | 8.8 | 550 | 28 |
| C. Ex. 11 | 96.5 | 4.9 | 100 | 94 | 99 | 9.3 | 760 | 31 |
| C. Ex. 12 | 97.2 | 4.6 | 89 | 102 | 95 | 9.7 | 870 | 85 |
| C. Ex. 13 | 98.3 | 23 | 32 | 107 | 110 | 11.8 | 1390 | 51 |
| C. Ex. 14 | 97.8 | 25 | 45 | 93 | 114 | 10.6 | 1230 | 44 |
| C. Ex. 15 | 99.1 | 3.2 | 98 | 84 | 125 | 10.5 | 1630 | 98 |
| C. Ex. 16 | 99.4 | 4.1 | 97 | 117 | 97 | 11.3 | 230 | 60 |

Ex.: Example
C. Ex.: Comparative Example

Tables 6 shows the relative density, average circular equivalent diameter, the number percentage of grains 20 μm or less in circular equivalent diameter, piezoelectric constant $d_{31}$ at room temperature, piezoelectric constant $e_{31}$, mechanical quality factor Qm, Young's modulus $Y_{11}$, and mechanical strength of calcium-doped piezoelectric ceramics of Examples 15 to 20 and Comparative Examples 17 to 32.

TABLE 6

| | Relative density (%) | Average circular equivalent diameter (μm) | Number percentage of grains 20 μm or less in circular equivalent diameter (%) | Piezoelectric constant $d_{31}$ (pm/V) | Young's modulus $Y_{11}$ (GPa) | $e_{31}$ (N/V·m) | Mechanical quality factor Qm | Mechanical strength (MPa) |
|---|---|---|---|---|---|---|---|---|
| Ex. 15 | 98.0 | 4.2 | 100 | 78 | 116 | 9.0 | 650 | 118 |
| Ex. 16 | 97.6 | 3.6 | 100 | 68 | 110 | 7.5 | 480 | 102 |
| Ex. 17 | 97.8 | 4.5 | 99 | 72 | 118 | 8.5 | 620 | 106 |
| Ex. 18 | 97.6 | 4.4 | 100 | 81 | 117 | 9.5 | 470 | 120 |
| Ex. 19 | 98.1 | 3.9 | 100 | 95 | 112 | 10.6 | 150 | 117 |
| Ex. 20 | 97.9 | 4.7 | 99 | 70 | 124 | 8.7 | 750 | 122 |
| C. Ex. 17 | 97.4 | 65 | 34 | 70 | 114 | 8.0 | 580 | 60 |
| C. Ex. 18 | 97.2 | 1.1 | 100 | 56 | 94 | 5.3 | 160 | 41 |
| C. Ex. 19 | 94.3 | 114 | 28 | 75 | 123 | 9.2 | 620 | 68 |
| C. Ex. 20 | 95.5 | 12 | 100 | 65 | 112 | 7.3 | 490 | 36 |
| C. Ex. 21 | 92.3 | 1.4 | 100 | 55 | 96 | 5.3 | 120 | 21 |
| C. Ex. 22 | 94.6 | 4.3 | 100 | 58 | 91 | 5.3 | 530 | 64 |
| C. Ex. 23 | 97.3 | 13 | 92 | 73 | 114 | 8.3 | 610 | 40 |
| C. Ex. 24 | 96.3 | 2.3 | 99 | 69 | 109 | 7.5 | 210 | 55 |
| C. Ex. 25 | 97.5 | 27 | 78 | 81 | 121 | 9.8 | 630 | 83 |
| C. Ex. 26 | 94.5 | 1.2 | 100 | 54 | 97 | 5.2 | 110 | 53 |
| C. Ex. 27 | 93.4 | 4.1 | 99 | 66 | 105 | 6.9 | 340 | 78 |
| C. Ex. 28 | 96.8 | 3.8 | 99 | 68 | 111 | 7.5 | 280 | 83 |
| C. Ex. 29 | 97.6 | 13 | 88 | 76 | 120 | 9.1 | 630 | 76 |
| C. Ex. 30 | 97.5 | 22 | 42 | 51 | 107 | 5.5 | 540 | 65 |
| C. Ex. 31 | 97.8 | 4.4 | 91 | 58 | 127 | 7.4 | 760 | 110 |
| C. Ex. 32 | 96.8 | 4.5 | 93 | 81 | 102 | 8.3 | 80 | 113 |

Ex.: Example
C. Ex.: Comparative Example

Table 7 shows the relative density, average circular equivalent diameter, the number percentage of grains 20 μm or less in circular equivalent diameter, piezoelectric constant $d_{31}$ at room temperature, piezoelectric constant $e_{31}$, mechanical quality factor Qm, Young's modulus $Y_{11}$, and mechanical strength of the piezoelectric ceramics having a calcium-doped composition obtained in Examples 21 to 26 and Comparative Examples 33 to 48.

TABLE 7

| | Relative density (%) | Average circular equivalent diameter (μm) | Number percentage of grains 20 μm or less in circular equivalent diameter (%) | Piezoelectric constant $d_{31}$ (pm/V) | Young's modulus $Y_{11}$ (GPa) | $e_{31}$ (N/V·m) | Mechanical quality factor Qm | Mechanical strength (MPa) |
|---|---|---|---|---|---|---|---|---|
| Ex. 21 | 98.0 | 4.3 | 100 | 94 | 113 | 9.5 | 530 | 125 |
| Ex. 22 | 97.6 | 4.1 | 100 | 83 | 106 | 8.0 | 420 | 110 |
| Ex. 23 | 97.8 | 5.3 | 99 | 88 | 112 | 9.0 | 510 | 115 |
| Ex. 24 | 97.6 | 3.8 | 100 | 95 | 114 | 10.0 | 400 | 123 |
| Ex. 25 | 98.1 | 4.1 | 100 | 101 | 107 | 11.1 | 120 | 121 |
| Ex. 26 | 97.9 | 5.2 | 100 | 84 | 118 | 9.2 | 1050 | 131 |
| C. Ex. 33 | 97.4 | 54 | 21 | 86 | 120 | 8.5 | 550 | 71 |
| C. Ex. 34 | 97.2 | 1.1 | 100 | 80 | 89 | 5.5 | 130 | 53 |
| C. Ex. 35 | 94.3 | 87 | 15 | 89 | 116 | 9.7 | 650 | 74 |
| C. Ex. 36 | 95.5 | 23 | 100 | 81 | 106 | 7.6 | 470 | 42 |
| C. Ex. 37 | 92.3 | 1.2 | 100 | 71 | 92 | 5.5 | 80 | 25 |
| C. Ex. 38 | 94.6 | 4.6 | 100 | 75 | 84 | 5.5 | 510 | 70 |
| C. Ex. 39 | 97.3 | 8 | 98 | 85 | 109 | 8.7 | 590 | 51 |
| C. Ex. 40 | 96.3 | 2.7 | 100 | 82 | 106 | 7.9 | 190 | 66 |
| C. Ex. 41 | 97.5 | 34 | 81 | 98 | 114 | 10.3 | 640 | 93 |
| C. Ex. 42 | 94.5 | 1.1 | 100 | 66 | 94 | 5.4 | 110 | 55 |
| C. Ex. 43 | 93.4 | 3.9 | 98 | 73 | 100 | 7.2 | 320 | 81 |
| C. Ex. 44 | 96.8 | 3.5 | 100 | 71 | 108 | 7.8 | 270 | 85 |
| C. Ex. 45 | 97.6 | 14 | 84 | 91 | 116 | 9.6 | 610 | 84 |
| C. Ex. 46 | 97.5 | 26 | 56 | 65 | 101 | 5.7 | 470 | 72 |
| C. Ex. 47 | 97.8 | 4.1 | 97 | 75 | 120 | 7.8 | 860 | 118 |
| C. Ex. 48 | 96.8 | 5.6 | 95 | 94 | 98 | 8.7 | 60 | 121 |

Ex.: Example
C. Ex.: Comparative Example

The piezoelectric ceramics in Tables 5, 6 and 7 were each polished into a disk-shaped sample having a thickness of 1 mm to be used in X-ray diffractometry (XRD), X-ray fluorescence (XRF) analysis, and Archimedean density measurement.

Although not indicated in Tables 5, 6 and 7, all of the piezoelectric ceramics were crystals having a perovskite single phase mainly composed of barium titanate.

All of the piezoelectric ceramics of Examples 1 to 14 exhibited good density, namely 5.86 g/cm³ or more compared to the theoretic density of barium titanate, 6.01 g/cm³ or more. This means the relative density was 97.5% or more. All of the calcium-doped piezoelectric ceramics of Examples 15 to 20 exhibited good density, namely 5.62 g/cm³ or more compared to the theoretic density of calcium-doped barium titanate, 5.76 g/cm³ or more. This means the relative density was 97.5% or more. All of the piezoelectric ceramics of Examples 21 to 26 exhibited good density, namely, 5.75 g/cm³ or more compared to the theoretic density of zirconium-doped barium titanate, 5.85 g/cm³. This means the relative density was 98.0% or more.

A microscope was mainly used to observe the state of crystal grains of piezoelectric ceramics. Observation was conducted on a surface of a ceramic after sintering and after polishing. No significant difference was observed in size or state of the crystal grains. Although the values observed on the surface after sintering were employed as the data of the average circular equivalent diameter and the number percentage of grains 20 μm or less in circular equivalent diameter, the same tendency was observed in a cross-section produced by polishing.

Figure 2:
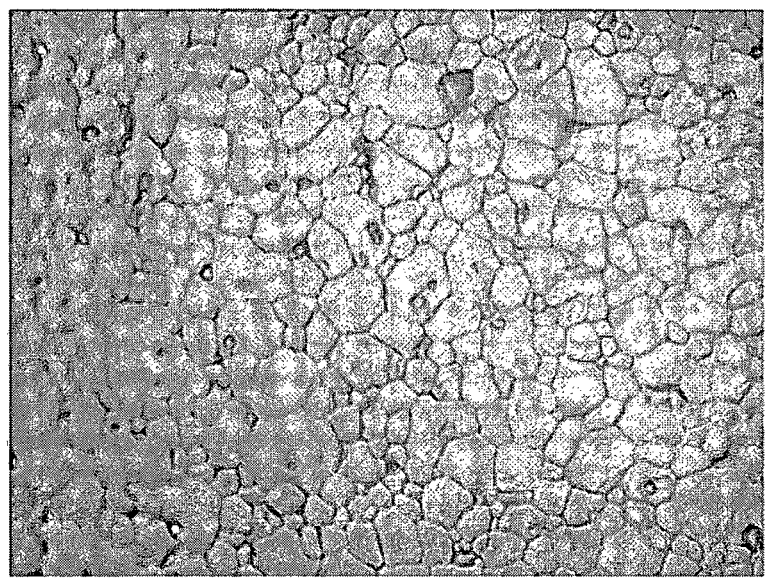
FIG. 2 is a microscope photograph of a surface of a piezoelectric ceramic of Example 1.
Figure 3:
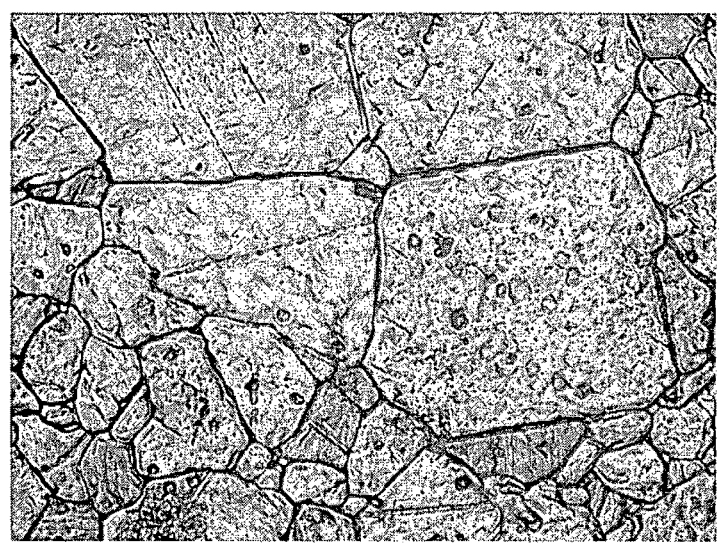
FIG. 3 is a microscope photograph of a surface of a piezoelectric ceramic of Comparative Example 1.

Examples of the photographs taken by microscopy are shown in FIGS. 2 and 3.

FIG. 2 is a photograph of a magnified surface of the piezoelectric ceramic of Example 1 taken with a microscope. The circular equivalent diameter is measured from this photograph and the result is shown in Table 3. It was confirmed that in Examples 1 to 26, the average circular-equivalent diameter was 2 μm or more and 9 μm or less and the number percentage of the crystal grains having a circular equivalent diameter of 20 μm or less is 99% or less.

FIG. 3 is a photograph of a magnified surface of the piezoelectric ceramic of Comparative Example 1 taken with a microscope. The circular equivalent diameter is measured from this photograph and the result is shown in Table 3. It was confirmed that in Comparative Example 1, abnormal grain growth was observed and the average circular equivalent diameter was 20 μm or more. This may be the cause of a low mechanical strength.

The crystal structure was identified by using a X-ray diffraction analyzer in a 2θ/θ mode. As a result, it was found that all of the piezoelectric ceramics of Examples and Comparative Examples had a tetragonal structure with c/a of about 1.02.

Determination of the manganese content was conducted by ICP analysis and wavelength dispersive X-ray spectroscopy using an XRF analyzer (produced by PANalytical). As a result, the Ba/Ti ratio, the (Ba+Ca)/Ti ratio, and the manganese content were identified. It was confirmed that they were substantially the same as the composition of the feed.

Evaluation of Piezoelectric Constant

Gold was deposited, by DC sputtering, on both sides of each of the piezoelectric ceramics obtained in Examples 1 to 26 and Comparative Examples 1 to 48 to form gold electrodes. Each of the ceramics with the electrodes was cut into a ceramic strip 12 mm×3 mm×1 mm in size.

The ceramic strip was polarized in silicone oil. The oil temperature was 100° C., the polarizing voltage was DC 1 kV, and the voltage application time was 30 minutes.

The piezoelectric constant was measured by using the polarized ceramic strip. In particular, an impedance analyzer (trade name: 4294A produced by Agilent) was used to determine the dependency of the impedance of the ceramic sample on a frequency. Then the piezoelectric constant $d_{31}$ (pm/V) was determined from the observed resonance frequency and antiresonance frequency. The higher the absolute value of a negative piezoelectric constant $d_{31}$, the higher the piezoelectric performance. The mechanical quality factor Qm and the Young's modulus $Y_{11}$ can also be determined. The piezoelectric constant $e_{31}$ can be calculated as the product of the Young's modulus $Y_{11}$ and the piezoelectric constant $d_{31}$. The results are shown in Tables 4 and 5.

The results in Tables 4 and 5 show that the samples having a large average circular equivalent diameter tend to exhibit a high mechanical quality factor Qm but a low mechanical strength. Samples having an average circular equivalent diameter of about 5 μm have a high piezoelectric constant $d_{31}$, a high piezoelectric constant $e_{31}$, which is the product of the piezoelectric constant $d_{31}$ and the Young's modulus $Y_{11}$, a high mechanical quality factor Qm, and a high mechanical strength of 100 MPa or more.

In order to evaluate the dependency of the properties on temperature, a thermostat heater was used and resonance and antiresonance measurement was conducted while changing the ambient temperature from −40° C. to 50° C. The temperature dependency of the Young's modulus $Y_{11}$ of Example 1 measured as such is shown in FIG. 4 and that of Comparative Example 1 is shown in FIG. 5.

Figure 4:
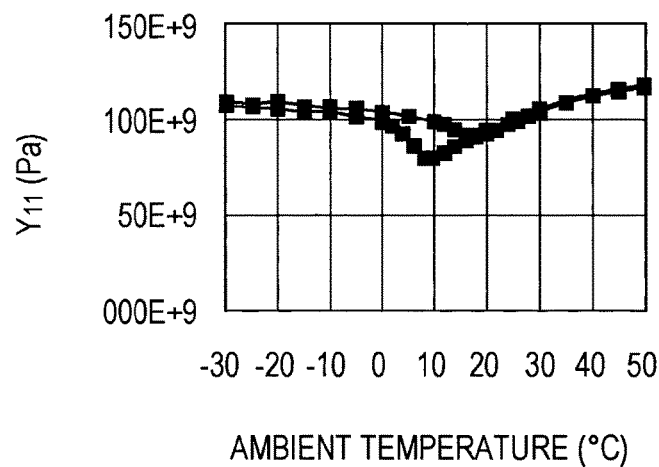
FIG. 4 is a graph showing the temperature property of $Y_{11}$ of an evaluation sample of a piezoelectric element of Example 1.

Referring to the Young's modulus $Y_{11}$ of Example shown in FIG. 4, the temperature at which the minima was observed differed between when the temperature is increased and when the temperature is decreased and the difference was about 10° C. The piezoelectric constant $e_{31}$ which is the product of the piezoelectric constant $d_{31}$ and the Young's modulus $Y_{11}$ shows a stable value relative to the temperature since the maxima of the piezoelectric constant $d_{31}$ differed between when the temperature is increased and when the temperature is decreased by about 10° C. and this set off the difference.

Figure 5:
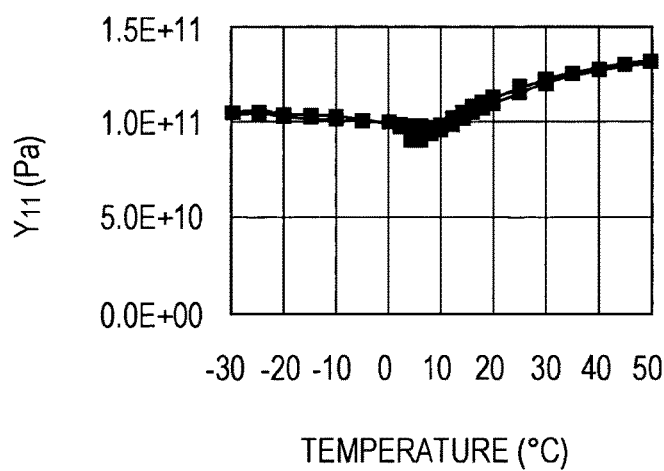
FIG. 5 is a graph showing the temperature property of $Y_{11}$ of an evaluation sample of a piezoelectric element of Comparative Example 1.

In contrast, according to the Young's modulus $Y_{11}$ of Comparative Example shown in FIG. 5, the difference in temperature between minima observed in when the temperature is increased and that when the temperature is decreased is as small as several degrees Celsius. Thus, a hysteresis appeared in which the piezoelectric constant $e_{31}$, which is the product of the Young's modulus $Y_{11}$ and the piezoelectric constant $d_{31}$, the maxima of which differed between when the temperature is increased and when the temperature is decreased by about 10° C., was different between when the temperature was increased and when the temperature was decreased.

Evaluation of Mechanical Strength

The mechanical strength was evaluated by a three-point bending test using a tensile testing instrument (trade name: Tensilon RTC-1250A produced by ORIENTEC Co., Ltd.). A ceramic strip 12 mm×3 mm×1 mm in size was used in the measurement. No electrode was formed and no polarization treatment was conducted. The maximum stress value observed when the stress is increased to fracture of the ceramic strip sample is given in Table 3. A mechanical strength sufficient for continuously driving the piezoelectric element is a maximum stress value of 100 MPa.

When the piezoelectric ceramics of Examples and the piezoelectric ceramics of Comparative Examples in Tables 4 and 5 are compared, it is clear that the piezoelectric ceramics of Examples are superior in terms of both piezoelectricity and mechanical strength.

Among Examples, samples having a high Mn content exhibited a high mechanical strength but the properties of Example 1 were superior since both mechanical strength and the piezoelectricity were high.

Example 27

A liquid discharge head and an ultrasonic motor shown in FIGS. 1 and 2 were made using the same piezoelectric ceramic as Example 1. It was confirmed that the liquid discharge head discharged ink according to an input electrical signal and that the ultrasonic motor rotated according to an input of an alternating voltage.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-264223, filed Nov. 26, 2010, which is hereby incorporated by reference herein in its entirety.

INDUSTRIAL APPLICABILITY

Since the piezoelectric ceramic of the present invention has good piezoelectric properties and mechanical strength and is environmentally friendly, the piezoelectric ceramic can be used in devices that frequently use piezoelectric ceramic, such as liquid discharge heads, ultrasonic motors, and piezoelectric elements.

REFERENCE SIGNS LIST d degreasing step
1 first temperature
2 second temperature
3 third temperature
1012 piezoelectric ceramic
101 piezoelectric element
105 discharge port
106 connecting hole
102 individual liquid chamber
107 common liquid chamber
103 vibrating plate
1011 first electrode
1013 second electrode
108 buffer layer
2011 elastic ring
2012 piezoelectric element
201 vibrator
202 rotor
204 vibrator
205 rotor
2042 piezoelectric element

The invention claimed is:

1. A method for making a piezoelectric ceramic, comprising:
- forming a compact composed of an oxide powder containing barium titanate particles;
- sintering the compact; and
- decreasing the temperature of the compact after the sintering,
- the sintering including
  - (A) increasing the temperature of the compact to a first temperature within a temperature range of a shrinking process of the compact;
  - (B) increasing the temperature of the compact to a second temperature within a temperature range of a liquid phase sintering process of the compact after (A);
  - (C) decreasing the temperature of the compact to a third temperature within the temperature range of the shrinking process of the compact after (B); and
  - (D) retaining the third temperature after (C),
- wherein the difference between the first temperature in (A) and the third temperature in (C) and (D) is 30° C. or less,
- wherein, in (A), the first temperature is retained for 60 minutes or more and 240 minutes or less,
- wherein, the second temperature is retained for 5 minutes or less after (B), and
- wherein, in (D), a cumulative time for which the third temperature is retained is 10 hours or more and 70 hours or less.

2. The method according to claim 1, wherein the first temperature is 900° C. or more and 1200° C. or less, the second temperature is 1350° C. or more and 1550° C. or less, and the third temperature is 900° C. or more and 1200° C. or less.

3. The method according to claim 1, wherein (B), (C), and (D) are repeated 2 to 20 times, wherein the cumulative time for which the third temperature is retained in the steps (D) is 10 hours or more and 70 hours or less.

4. The method according to claim 1, wherein the rate of increasing the temperature to the second temperature in (B) is 10° C./min or more and 30° C./min or less.

5. The method according to claim 1, wherein the sintering further includes, before (A), degreasing the compact by retaining the compact at a temperature lower than or equal to the first temperature.

6. The method according to claim 1, wherein the difference between the second temperature in (B) and the first temperature in (A) is 200° C. or more and 500° C. or less.

7. The method according to claim 1, wherein the oxide powder contains 0.04 to 0.20% by mass or less of manganese on a metallic basis relative to barium titanate.

8. The method according to claim 1, wherein primary particles of the barium titanate in the compact have an average particle diameter of 1 μm or less.

* * * * *